United States Patent [19]
Mulder et al.

[11] Patent Number: 4,716,314
[45] Date of Patent: Dec. 29, 1987

[54] INTEGRATED CIRCUIT

[75] Inventors: Cornelis Mulder, Eindhoven; Henricus E. J. Wulms, Eindhoven, both of Netherlands

[73] Assignee: U.S. Philips Corporation, New York, N.Y.

[21] Appl. No.: 602,473

[22] Filed: Aug. 6, 1975

[30] Foreign Application Priority Data

Oct. 9, 1974 [NL] Netherlands ..................... 7413264

[51] Int. Cl.$^4$ .................. H01L 27/04; H03K 19/091
[52] U.S. Cl. ................................ 307/477; 307/459; 357/45; 357/92
[58] Field of Search ............... 357/44, 46, 36, 35, 357/50, 92; 307/459, 477

[56] References Cited

U.S. PATENT DOCUMENTS

| | | | |
|---|---|---|---|
| 3,643,235 | 2/1972 | Berger et al. | 357/92 |
| 3,736,477 | 5/1973 | Berger et al. | 357/46 |
| 3,790,817 | 2/1974 | Dobkin | 307/215 |
| 3,823,353 | 7/1974 | Berger et al. | 357/46 |
| 3,922,565 | 11/1975 | Berger et al. | 357/92 |
| 3,978,515 | 8/1976 | Evans et al. | 357/92 |
| 4,056,810 | 11/1977 | Hart et al. | 357/92 |
| 4,065,680 | 12/1977 | Russell | 357/92 |
| 4,076,556 | 2/1978 | Agraz-Guerena et al. | 357/92 |
| 4,160,988 | 7/1979 | Russell | 357/92 |

OTHER PUBLICATIONS de Troye, Digest of Tech. Papers, IEEE International Solid–State Circuits Conf., Feb. 1974, pp. 12, 13, and 214.
Berger et al., Dig. of Tech. Papers, IEEE ISSCC, Feb. 1974, pp. 14, 15, 215.
Rogers, IEEE J. of Solid State Circuits, vol. SC 9, No. 5, Oct. 1974, p. 248.
de Troye, "Integrated Injection Logic ... ", IEEE J. of Solid State Circuits, vol. SC 9, No. 5, pp. 206–211, Oct. 1974.
Berger et al., IEEE J. of Solid State Circuits, vol. SC-7, No. 5, Oct. 1972, pp. 340–346.

Primary Examiner—William D. Larkins
Attorney, Agent, or Firm—Robert T. Mayer; Steven R. Biren

[57] ABSTRACT

A high speed I$^2$L circuit having a topology which is based on a layout of parallel arranged gate circuits in which the inverter transistors of each gate circuit are arranged in a row and below the signal lines to which they are connected, said signal lies extending transversely to the rows, while the complementary transistors for the current supply of the inputs of the gate circuits are situated laterally beside the signal lines. Said layout facilitates the designing of comparatively compact I$^2$L circuits in which various measures to increase their speed can be taken, for example, the use of dielectric isolation, reduction of the input series resistance, reversal of the doping profile and the application of a potential difference between the bases of the complementary transistors and the common emitter of the inverter transistors.

26 Claims, 20 Drawing Figures

INTEGRATED CIRCUIT

This invention relates to an integrated injection logic (I²L) circuit.

I²L circuits comprise gates each comprising one or more inverter transistors with common emitters, a base input and collector output, which are energized by a current source in the form of a complementary transistor. The inverter transistor emitter zone and complementary transistor base zone share a common region, and the inverter transistor base zone and complementary transistor collector zone share a common region. Such circuit arrangements are described in the published Dutch Patent Application No. 71.07040, and also in United States Patent Application, Ser. No. 253,348, filed May 15, 1972, corresponding to U.S. Pat. No. 4,286,177 the contents of which are herein incorporated by reference.

I²L circuits are generally considered to be particularly suitable for large scale integration (LSI) because they are bipolar circuits with which a high packing density can be realized which is comparable to that of integrated MOST circuits. Furthermore, the electric voltages in the logic circuits are particularly low. The voltage difference between the two logic levels is not larger than the forward voltage across a conductive diode, while the collector-emitter voltages across the inverter transistors both in the static condition and during switching from the conductive into the non-conductive state, or conversely, in absolute value always remain within said limit of a forward voltage drop. Also as a result of this, the dissipation of I²L circuits is favourably low.

It is a general object of the invention to further improve I²L circuits.

A first object of the invention is an I²L circuit having a topology which is suitable for and adapted to the use of computer-aided design wherein loss of packing density which, as is known, is always associated therewith, is minimized.

A second object of the invention is to effect the above mentioned adaptation of the topology and also to improve, or at least not sacrifice, the electrical performance of the gate circuits, in particular as regards their switching speed or delay time.

A further object of the invention is to provide an I²L circuit having an improved current supply so that the switching speed is increased.

Still another object of the invention is to provide an integrated circuit having improved I²L gates having a comparatively high switching speed.

Another object of the invention is to provide measures to reduce the charge storage in the inverter transistors.

These and other objects and advantages of the invention are realized, briefly stated, by I²L circuits incorporating one or more of the following constructional features:

a. A lay-out of the inverter transistors along substantially parallel isolated rows and such that the transistor collectors of the same gate circuit extend along the row and the transistor collectors of different gate circuits are interconnected by a group of substantially parallel signal conductor tracks extending transversely to the rows of inverter transistors. The complementary biasing transistors are arranged alongside the signal track group;

b. The provision of dielectric isolation between the inverter transistor base zones to isolate adjacent gate circuits;

c. The provision of means to reduce the input series resistance of the gate circuits. This may be achieved by various geometries providing highly-doped semiconductor regions leading from the signal input to the active parts of the inverter base zones. A preferred embodiment employs comb-shaped base zones with the comb base extending in the row direction, and the comb teeth transversely to the row direction;

d. A construction which physically separates the inverter transistor emitter zone from its associated complementary transistor base zone. This construction permits the establishment of a potential difference between the separated zones. Preferably this is achieved by means of an integrated impedance. In addition, this separated construction permits separate tailoring of the impurity profiles in the inverter transistor emitter zone and the complementary transistor base zone to optimize transistor gain and speed.

These and other features and advantages of the invention will be better understood from the following detailed description of a number of preferred embodiments of the invention taken in conjunction with the accompanying drawings, wherein.

Figure 3:
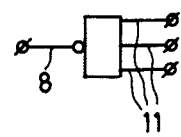
Figure 4:
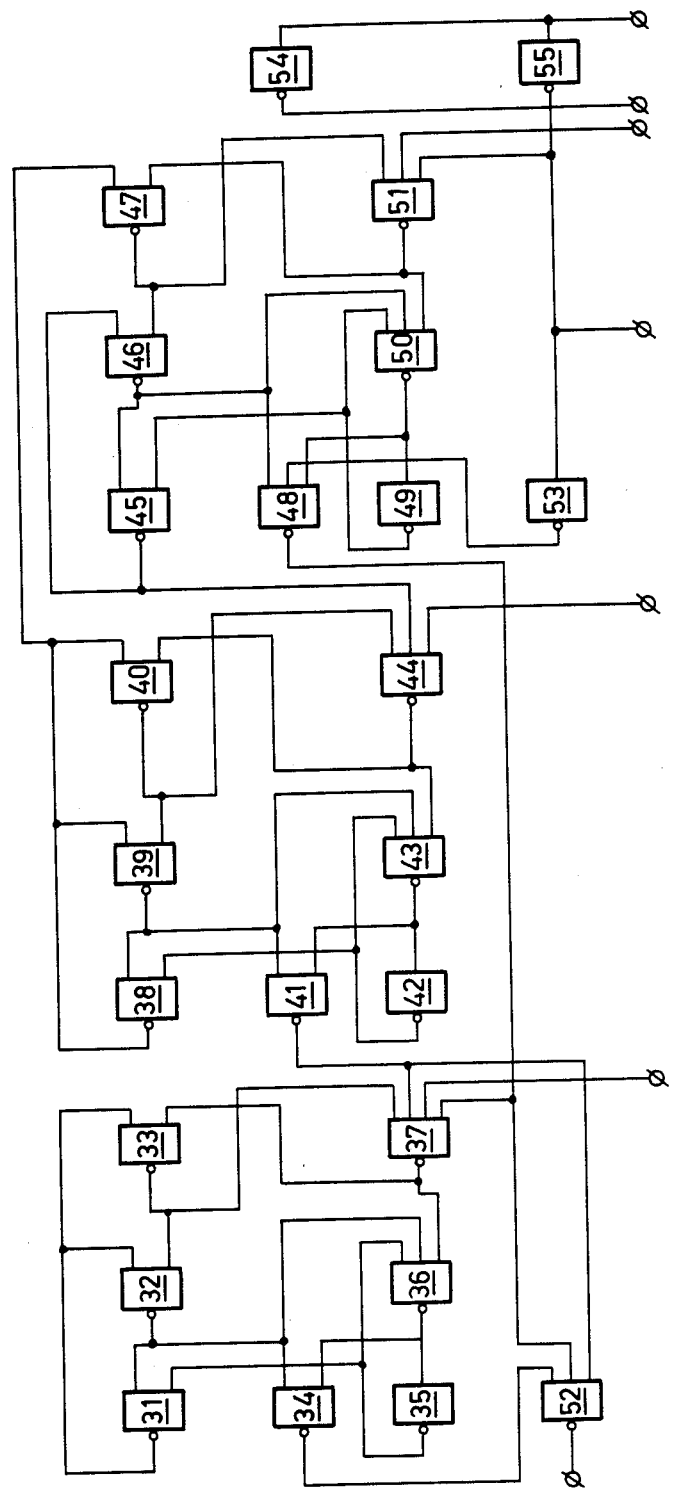
Figure 5:
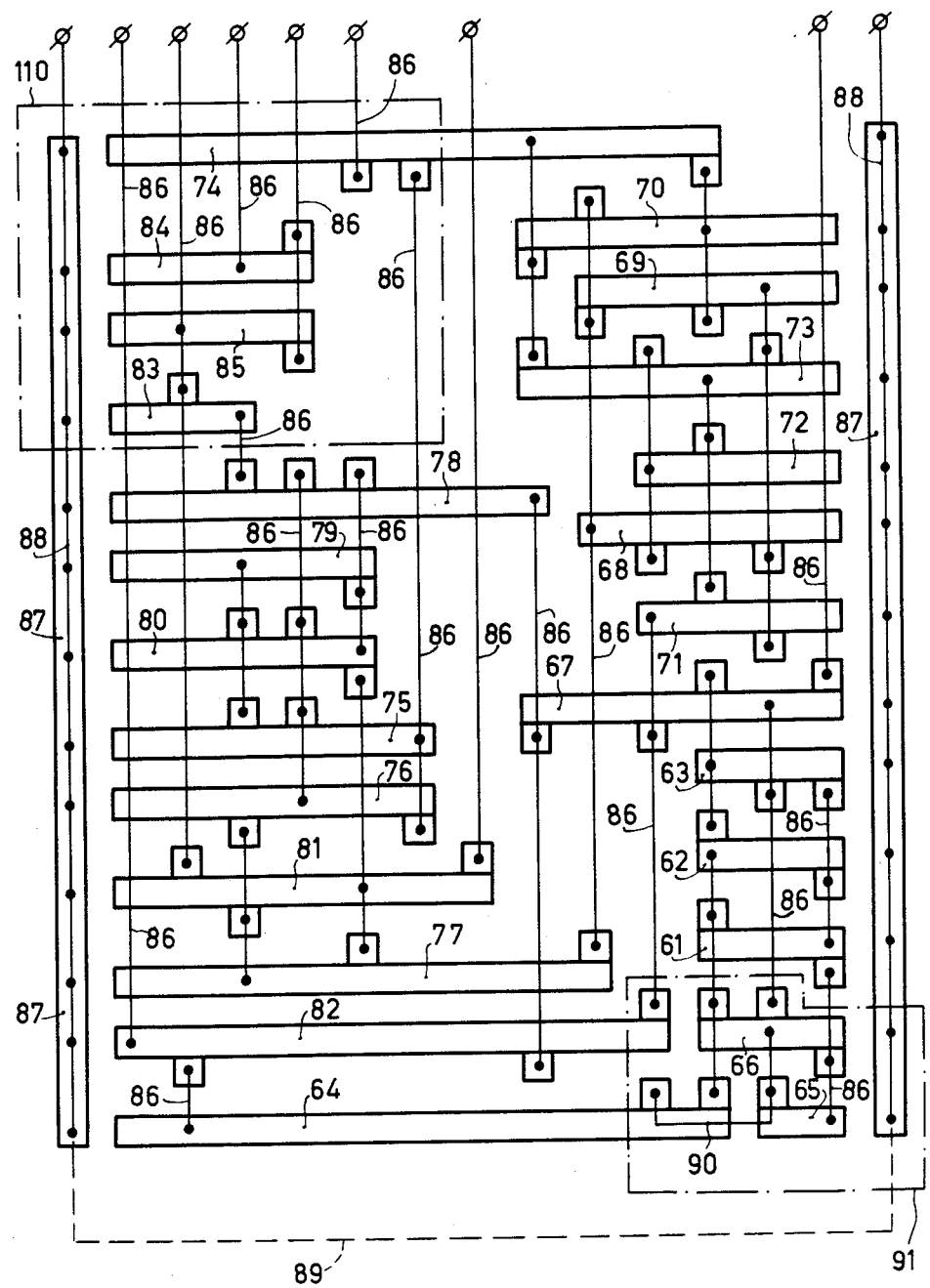
Figure 6:
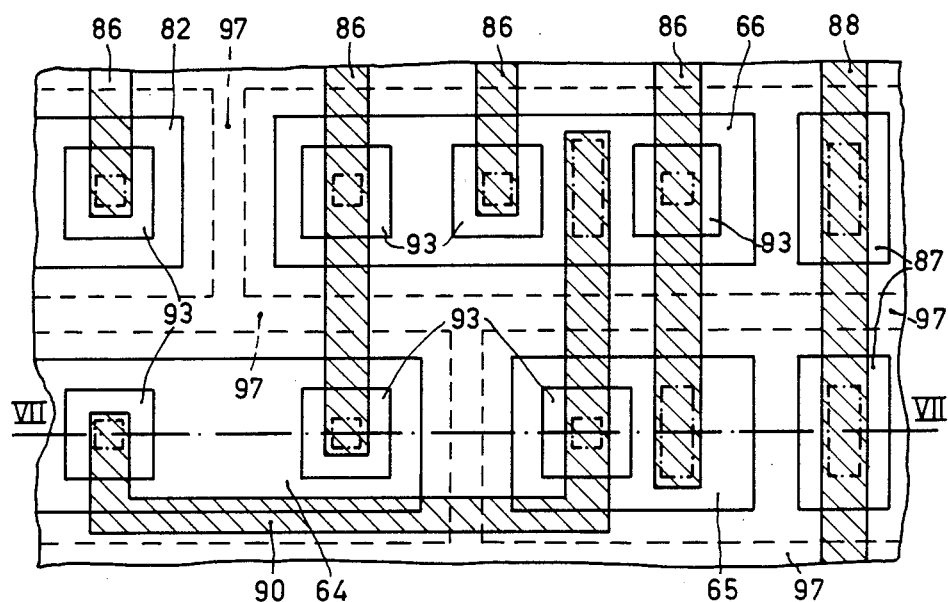
Figure 7:
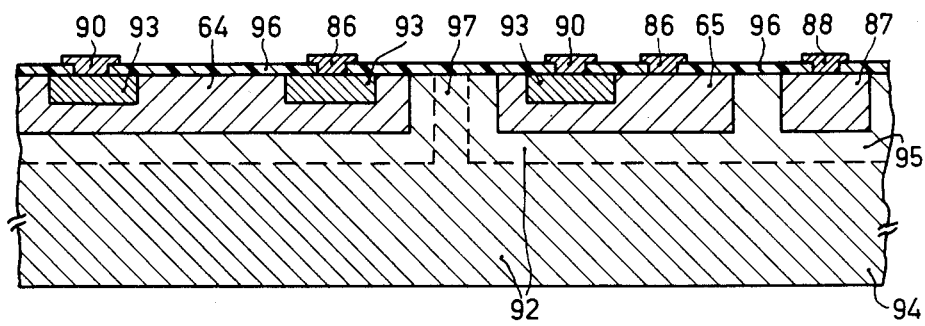

FIG. 4 shows the circuit diagram of a BCD-six counter in which the symbol shown in FIG. 3 is used as a component or building block, FIG. 5 shows diagrammatically the lay-out of the topology of an I²L circuit according to the invention for realizing the BCD-six counter shown in FIG. 4, FIG. 6 shows diagrammatically a part of a plan view of a first embodiment of the I²L circuit according to the invention based on the lay-out of FIG. 5, while FIG. 7 is a diagrammatic cross-sectional view of said first embodiment taken on the line VII—VII of FIG. 6.

Figure 8:
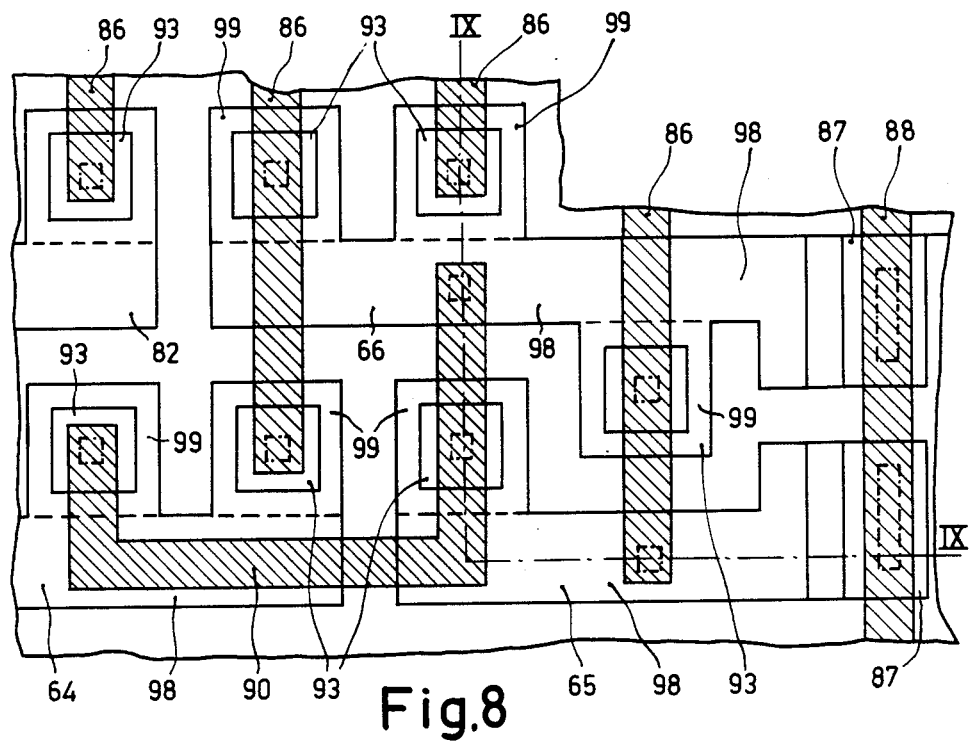
Figure 9:
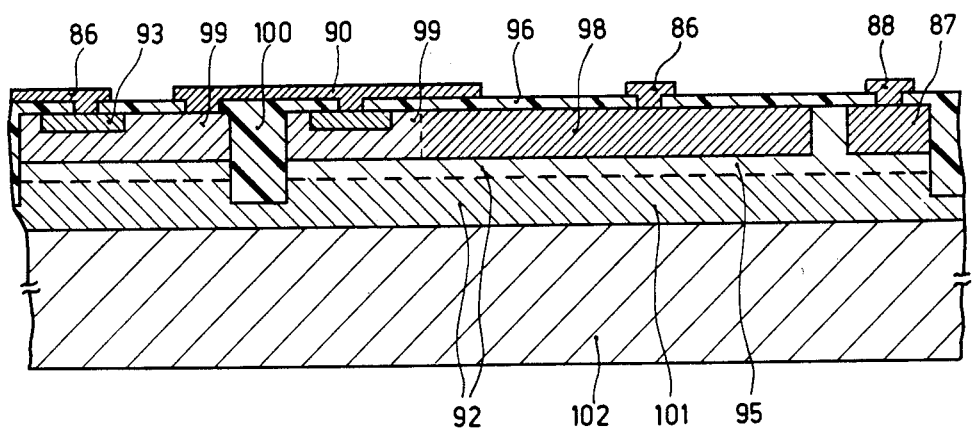

FIG. 8 shows diagrammatically a part of a second embodiment of the invention which is also based on the lay-out of FIG. 5, and FIG. 9 is an associated diagrammatic cross-sectional view taken on the line IX—IX of FIG. 8.

Figure 10:
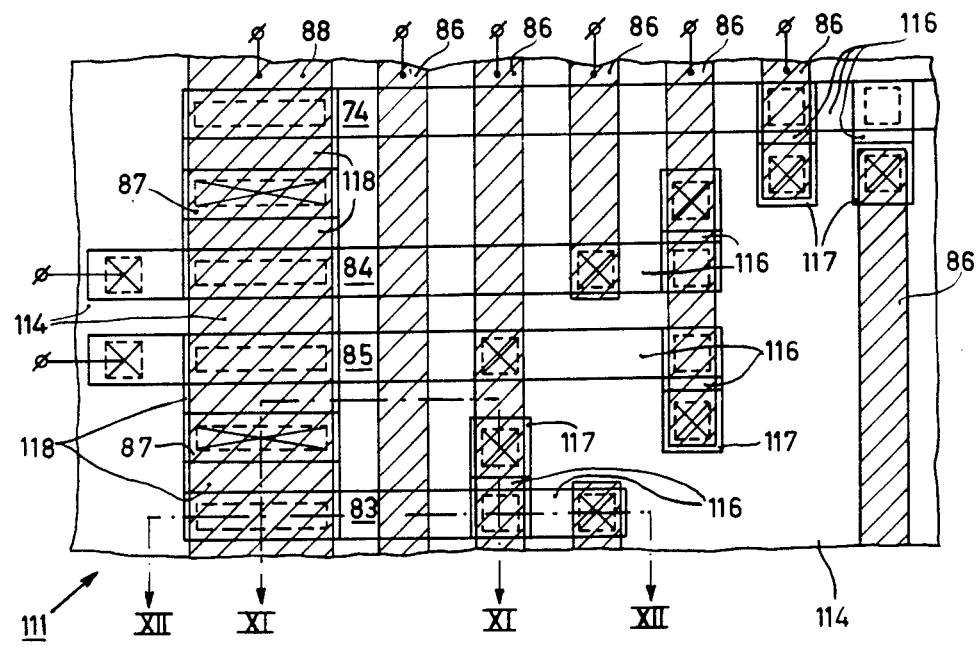
Figure 11:
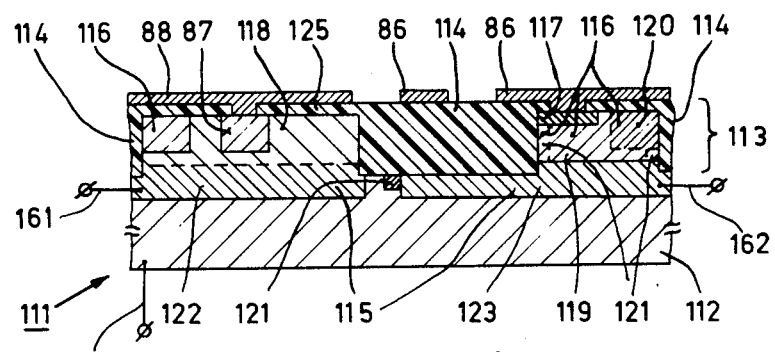
Figure 12:
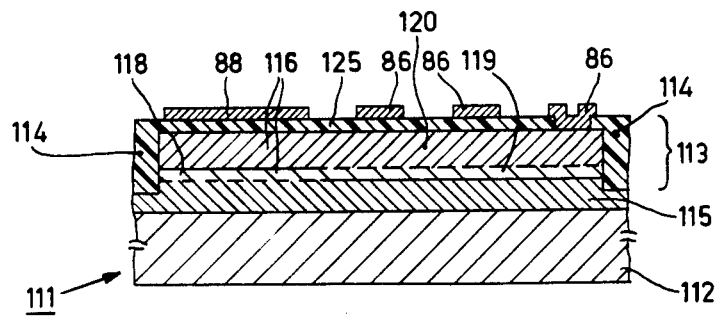

FIG. 10 is a diagrammatic plan view of a third embodiment of the integrated circuit according to the invention and of which FIGS. 11 and 12 show associated diagrammatic cross-sectional views taken on the lines XI—XI and XII—XII, respectively, of FIG. 10.

Figure 13:
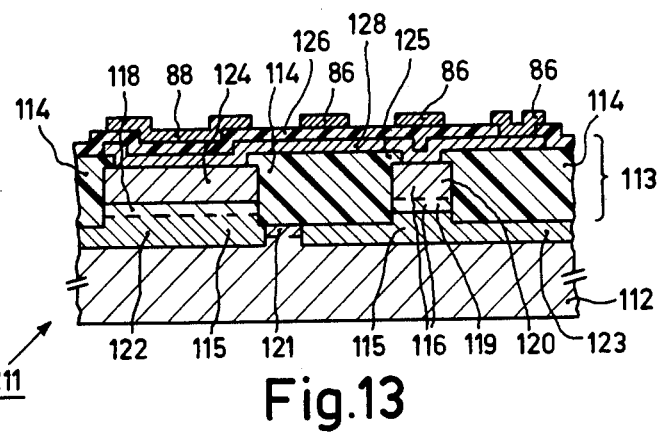

FIG. 13 is a diagrammatic cross-sectional view of a variation of the third embodiment corresponding to the cross-sectional view shown in FIG. 12.

Figure 14A:
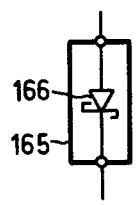
Figure 14:
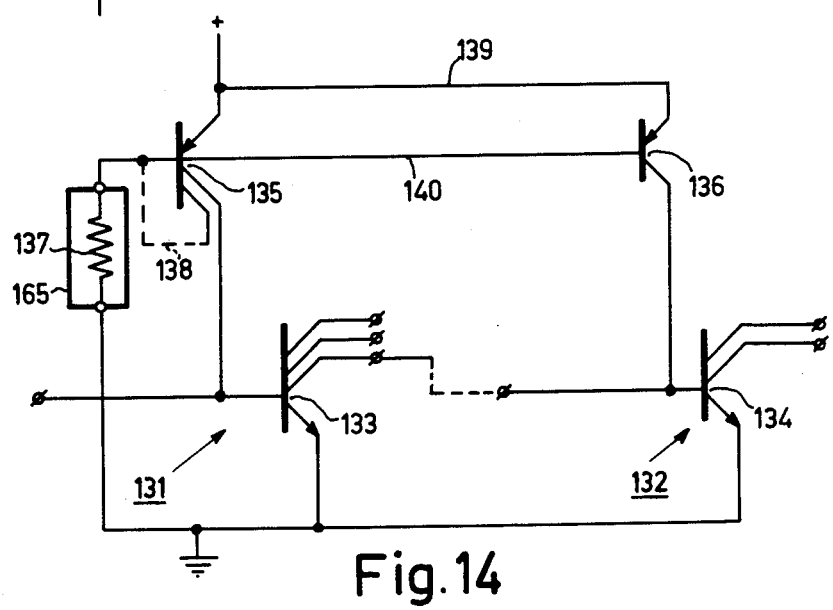

FIG. 14 is a circuit diagram of two I²L gate circuits with an example of an improved current supply according to the invention.

FIG. 14A shows another impedance element for use in the circuit of FIG. 14.

Figures 15, 15A:
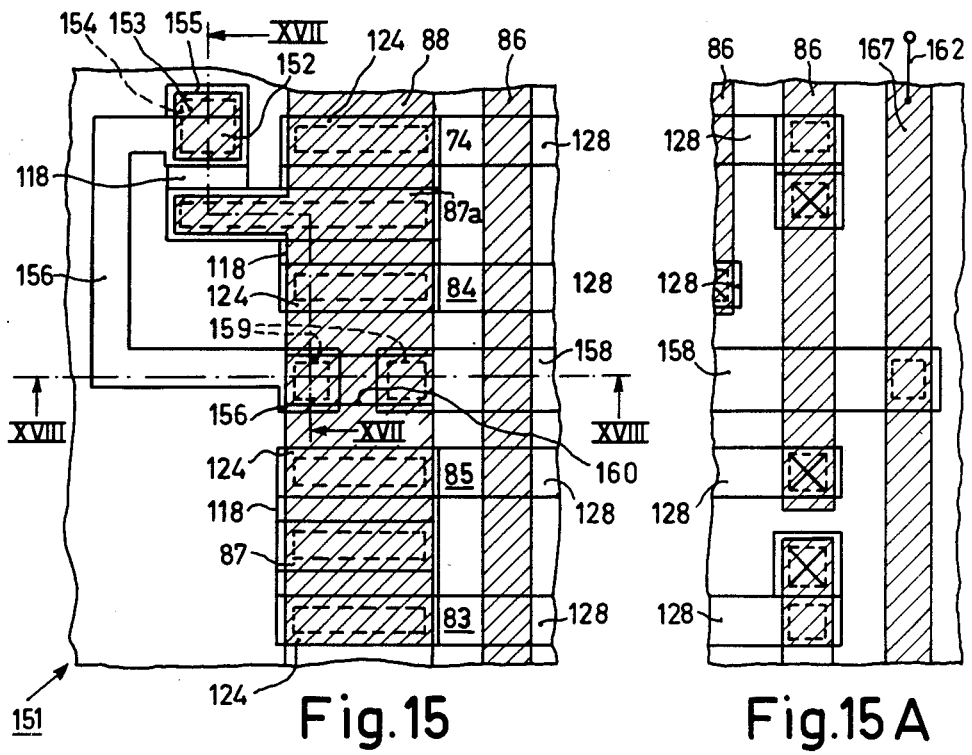

FIG. 15 shows diagrammatically a part of a plan view of a fourth embodiment of the I²L circuit according to the invention in which the improved current supply shown in FIG. 14 is incorporated in an integrated form.

FIG. 15A shows diagrammatically another part of a plan view of an I²L circuit according to the invention.

Figure 16:
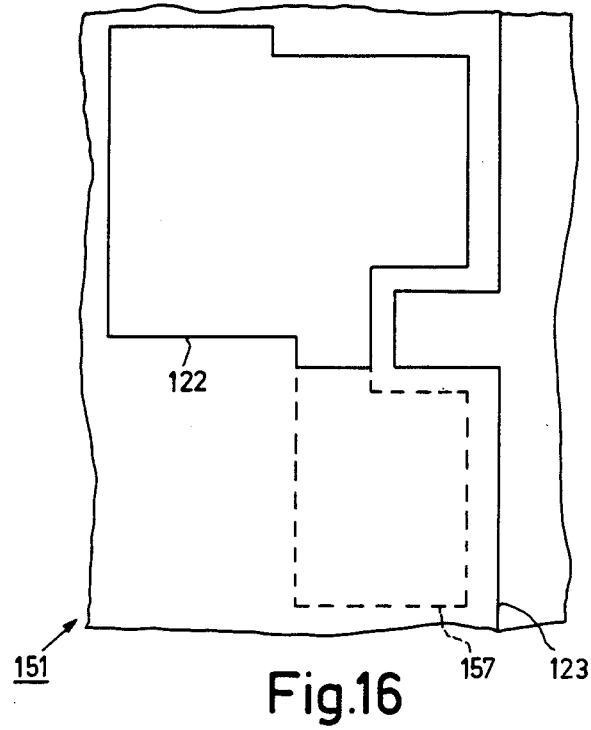
Figure 17:
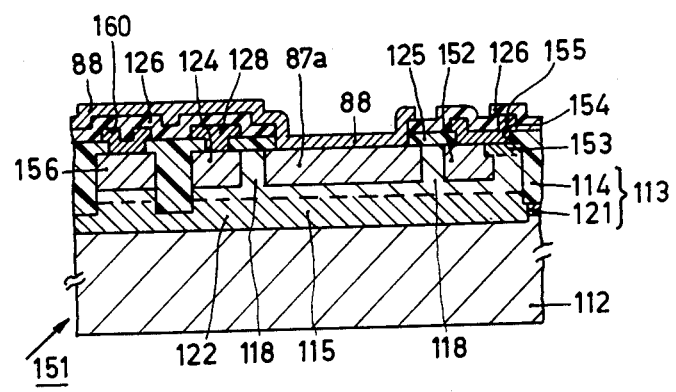
Figure 18:
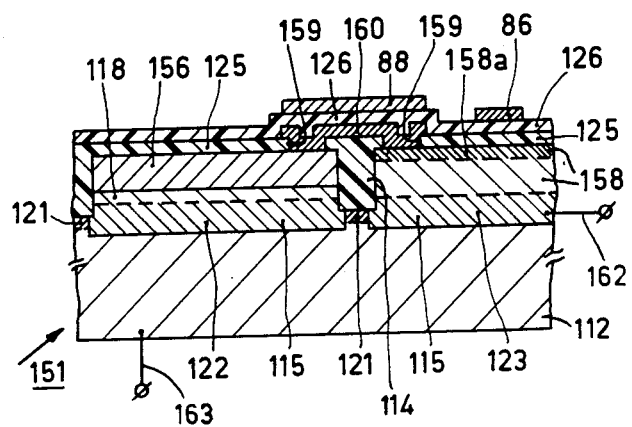

FIG. 16 shows diagrammatically a part of one of the masks to be used in the manufacture of the fourth embodiment and corresponding to the part of this embodiment shown in FIG. 15, while FIGS. 17 and 18 are diagrammatic cross-sectional views of said fourth embodiment taken on the lines XVII—XVII and XVIII—XVIII, respectively, of FIG. 15.

Figure 1:
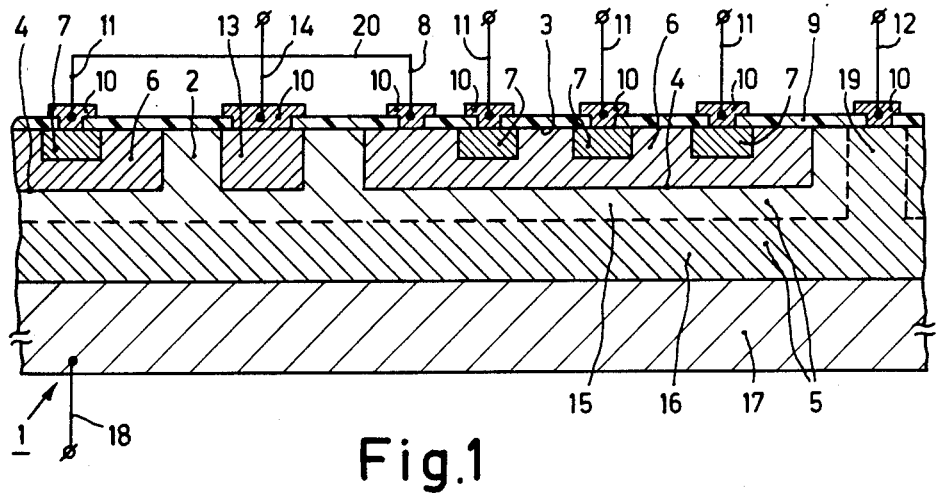
FIG. 1 is a diagrammatic crosssectional view of a known form of an I²L circuit.

FIG. 1 is a diagrammatic cross-sectional view of one of the examples of an I²L circuit described in the said Dutch Patent Application No. 71.07040. It is an integrated circuit having a semiconductor body 1 with a surface layer 2 of a first conductivity type in which at one side 3 of the semiconductor body 1 and of the surface layer 2 the circuit elements of the logic gate circuits are present. Each of the gate circuits has one or more inverter transistors 5, 6, 7 of which the emitter-base junctions 4 are connected in parallel. The emitters 5 of said transistors 5, 6, 7 of the various gate circuits are connected together and are formed by a common region 5 of the first conductivity type which, viewed from the one side 3, extends below each of the base zones 6 of the inverter transistors 5, 6, 7. The bases 6 of the inverter transistors 5, 6, 7 belonging to the same gate circuit are connected together and together constitute a single signal input 8 of the relevant gate circuit. The interconnected bases are formed by a common surface zone 6 of the second conductivity type which extends in the surface layer 2 from the one side 3. Present at the one side 3 is furthermore an insulating layer 9 which separates a pattern of conductor tracks 10 from the semiconductor body, said conductor tracks 10 being connected locally to the circuit elements via apertures in the insulating layer 9 so that contacts are formed with the circuit elements. The signal input 8 of each gate circuit hence comprises in this case a conductor track 10 and a common base zone 6 connected thereto. The collectors 7 which belong to the signal outputs 11 of the gate circuit are formed by surface zones 7 of the first conductivity type which adjoin the one side 3 of the semiconductor body 1 and extend in the base zones 6. The base-collector junctions are in this case p-n junctions formed between the base zones 6 and the collector zones 7. However, the base-collector junctions may also be junctions of the Schottky type, in which the collectors have, for example, a metal layer which forms a rectifying metal-to-semiconductor junction with the relevant adjoining base zone. Each signal output 11 of the gate circuit comprises a conductor track 10 and a collector 7 connected thereto.

Each gate circuit has a current supply source. For that purpose, each signal input 8 is connected to the collector of a transistor 13, 2, 6 which is complementary to the inverter transistors 5, 6, 7. The collector of said complementary transistor is the surface zone 6 of the second conductivity type which extends in the surface layer 2 from the one side 3, the connection to the signal input 8 of the gate circuit being realized in that said collector zone of the complementary transistor 13, 2, 6 is also the common base zone of the inverter transistors 5, 6, 7 of the gate circuit. The complementary transistor furthermore has an emitter zone 13 which is provided with a connection 14 formed by a conductor track 10, while the base zone of said transistor is formed by a part of the surface layer 2 which is directly connected to the emitter zone 5 which is common to all inverter transistors. The complementary transistor 13, 2, 6 is a so-called lateral transistor and the inverter transistors 5, 6, 7 are constructed as vertical transistors and in particular as inverse vertical transistors.

The surface layer 2 has a comparatively high resistivity and may be provided on a comparatively low resistivity substrate of the same conductivity type. In the present example the emitter zone 5 has, besides a comparatively high resistivity part 15 belonging to the surface layer 2, a relatively low resistivity part 16 of the same conductivity type which has, for example, the form of a buried layer which on one side adjoins the surface layer 2 and on the other side adjoins a substrate region 17 of the opposite second conductivity type. The substrate region 17 has an electric connection 18 which is shown diagrammatically. This construction provides the possibility of incorporating the I²L circuit as a component part in a larger integrated circuit. Such an integrated circuit typically has a surface layer which is subdivided in the usual manner into several parts or islands separated from each other, one or several of the said islands comprising an I²L circuit or a part thereof, the circuit elements of the remaining parts of the circuit being accommodated in a number of other of said islands.

The various gate circuits of the I²L circuit must be separated from each other so that no crosstalk occurs. In other words, transistor action between adjacent common base zones 6, which base zones together with the intermediate part of the surface layer 2 can actually form a lateral parasitic transistor, must be prevented. Furthermore, the current amplification factor $\beta$ of the inverter transistors 5, 6, 7 should not be too low which could impair proper operation of the integrated circuit. In particular this latter requirement may give rise to problems due to the use of inverse vertical transistors which generally have a much lower current amplification factor $\beta$ than the more conventional non-inverted vertical transistors. In the above mentioned Dutch Patent Application No. 71.07040 it is already stated in this connection that the common base zone 6 of each gate circuit, in so far as it does not face the emitter zone 13 of the associated complementary lateral transistor, must preferably be surrounded as much as possible by an isolation region 19 which can be formed, for example, by a groove in the semiconductor body covered or not covered with an insulating layer and filled or not filled with insulating material or semiconductor material, or by a pattern of insulating material which is inset at least over a part of its thickness in the semiconductor body and is obtained by selective or local oxidation, or, as illustrated, by a comparatively low resistivity region of the same conductivity type as the surface layer 2. In all cases it is of importance that the isolation region 19 extends as much as possible from the one side 3 down to or down into the low resistivity part 16 of the common emitter zone 6 and hence extends right through the surface layer 2.

The gate circuits usually each comprise several inverter transistors, thus several collectors 7 or signal outputs 11. To provide or generate logic functions, several signal outputs 11 belonging to different gate circuits are connected together by means of conductor tracks 10 belonging to the pattern of conductor tracks, at least a number of signal outputs 11 being connected to the signal input 8 of a subsequent one of the gate circuits for further processing of the output signals. Such a connection is denoted diagrammatically in FIG. 1 by reference numeral 20.

During operation of the circuit, the supply current supplied via the lateral transistor 13, 2, 6 to the common base zone 6 of the above mentioned subsequent gate circuit is used as a base current for the inverter transistors of the subsequent gate circuit, dependent on the logic input signal, or is routed to the common emitter zone 5 and the contact 12 connected thereto, in the form of collector current by one or more inverter transistors of the preceding gate circuit connected to the input of said subsequent gate circuit.

One of the characteristics of the I²L circuit is that during operation the collector-emitter voltage across the inverter transistors is always between zero and an emitter-base forward voltage drop. The collector of a non-conductive inverter transistor is connected to the base of a subsequent conductive inverter transistor, so that the collector-emitter voltage across the non-conductive inverter transistor is substantially equal to the forward voltage across the emitter-base junction of said subsequent conducting inverter transistor. When the non-conductive preceding inverter transistor switches to the conductive state when sufficient base current is presented, the collector-emitter voltage drops to the value associated with an inverter transistor in saturation. As a result of this the emitter-base voltage across the above mentioned subsequent inverter transistor is too small to maintain the conductive state. Said subsequent transistor thereby changes to the non-conductive state. So the conductive inverter transistors are always in saturation, i.e. the emitter-base junction and the collector-base junction of the conductive inverter transistors both are biased in the forward direction.

At least partly due to the use of inverter transistors having a common emitter zone and at least partly due to the absence of resistors, the known I²L circuit described has a high packing density. Also as a result of the low operating voltages, the dissipation is comparatively small. The product of dissipation and delay time of an I²L circuit is in the order of 1 p$^J$ per gate circuit or even lower.

Figure 2:
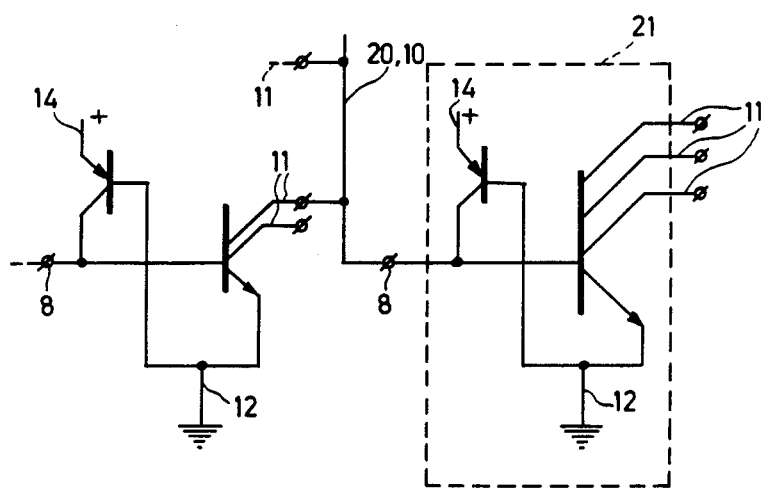
FIG. 2 is a circuit diagram of a known logic gate circuit with which an I²L circuit can be designed and, FIG. 3 shows a simple symbol for such a gate circuit.

The known I²L circuit described may be represented in an electric circuit diagram as is shown in FIG. 2, in which corresponding components are referred to by the same reference numerals as in FIG. 1. The gate circuits, as shown in the dashed rectangle 21, each consist of a multicollector-inverter transistor having the same number of collectors as there are outputs 11. Furthermore they have a single signal input 8 to which a complementary transistor is coupled for the supply of bias current. In this case the inverter transistors are n-p-n transistors and the complementary transistors are p-n-p transistors. A positive potential, relative to a reference potential applied at 12, can be applied to the emitter of the complementary p-n-p transistor at 14. It is also indicated that the signal input 8 is connected, with a connection 20 belonging to the pattern of conductor tracks 10, to one or more outputs 11 of preceding gate circuits.

For purposes of simplifying the illustration, the gate circuit present in the block 21 denoted in broken lines may also be represented by the symbol shown in FIG. 3. This simplified representation as shown in FIG. 3 is used in FIG. 4. FIG. 4 shows the diagram of a BDC-six counter constructed from twenty-five gate circuits, twenty-one of which form three D-flipflops in three groups of seven. This counter is suitable, for example, for use in electronic watches. The gate circuits are referenced 31 to 55.

A first aspect of the invention will now be described in greater detail with reference to the circuit of FIG. 4. This first aspect relates in the first instance to the topology to be chosen for the integrated circuit, it being of prime importance that such topology should be suitable for and adapted to the use and aid of computers in designing the topology. Thus is relates to a lay-out for the topology within which the more detailed topology of specific circuits can be designed by means of a computer. Such a lay-out is of importance in particular for large integrated circuits which are usually referred to as MSI or LSI circuits (derived from Medium Scale Integration and Large Scale Integration) in which the manual design consumes much time and hence is often too expensive and moreover involves a great risk for making mistakes. Although in this connection the counter shown in FIG. 4 is comparatively small, said circuit nevertheless is already sufficiently large to make attractive the use of computers in choosing a suitable arrangement of the gate circuits and the determination of the associated wiring pattern and it is also sufficiently large to explain the principle, a number of possibilities, and a number of advantages of the present invention.

As is known, the use of computers in designing, which is often referred to as a form of computer-aided design, is achieved substantially always at the expense of a reduced packing density of the gate circuits in the semiconductor body. A first consideration in the choice of the lay-out for the topology is therefore nevertheless to keep the topology as compact as possible. In this connection, among other things, the number of inverter transistors, so the number of collectors, which is deemed permissible per gate circuit also play a part. According as this number becomes larger, a complex function can generally be realized in a more compact form.

Other important considerations relate to the switching speed of the integrated circuit. This speed also is closely related to the chosen topology. Generally, for example, the possibility is great that the switching speed will decrease when the number of inverter transistors per gate circuit increases.

In addition, and leaving aside the switching speed, when the number of inverter transistors per gate circuit is increased, reliable operation of the I²L circuit is easily endangered as a result of the restricted current amplification factor $\beta$ of the inverse inverter transistors. For good operation it is required that said current amplification factor $\beta$ per signal output be at least 1. To reduce rejects, it will be endeavoured in practice to achieve a value of, for example, 1.5 or 2 or even higher for the current amplification factor $\beta$ per collector in accordance with the desired safety factor. In addition, such a higher value of the factor $\beta$ provides a noise margin which is desired in practice and in the presence of which less stringent requirements need be imposed upon the mutual equality of the transistors and of the currents conveyed by said transistors. In this connection, the current amplification per collector or signal output is to be understood to mean the current amplification of the multicollector transistor which actually occurs—so in the presence of the complementary transistor—when when only one of the collectors conveys current. Said current amplification factor can be measured, for example, as the ratio between the collector current and the base current of the conductive inverter transistor when the emitter-base junction of the complementary lateral transistor is short-circuited and hence the emitter of said lateral transistor is connected to that of the inverter transistor.

The lay-out of the topology must thus, among other things, meet the condition that the I²L circuit can be designed with the aid of computers in such manner that the resulting design operates reliably, is as compact as possible, restricts the maximum number of the inverter transistors per gate circuit as little as possible, does not impede too much the realization of the required current amplification $\beta$, and enables the highest possible switching speed or at least presents the possibility of taking measures to increase the switching speed in the integrated circuit.

According to the invention, which is based among other things on the above described analysis, the topology shown diagrammatically in FIG. 5 is particularly favorable. In this diagrammatic representation the inverter transistors of each of the gate circuits are shown as elongate blocks 61 and 62 through 85, respectively, each block having a square projection at the area where a signal output is present. According to the invention, the inverter transistors are distributed among several substantially parallel rows in that each row contains, arranged in the row direction, at least the collectors of the inverter transistors of the same one gate circuit and whose emitter-base junctions are connected in parallel. In this example there are twenty-five gate circuits 61-85 distributed among thirteen rows, shown extending horizontally in FIG. 5, the collectors or signal outputs of each gate circuit being arranged in the direction of or along the rows. As shown in FIG. 5, the collectors may be present at the lower side of the elongated block, as is denoted in block 74, or at the upper side of the block, as is shown, for example, in the block 78, or may be also present on either side of the block as is shown, for example, in block 80. As will be explained hereinafter the choice depends on the more detailed structure of the gate circuits.

Collectors present in different rows, and associated with different gate circuits, for example, the collectors of the blocks 84 and 85, are connected together by means of conductor tracks belonging to a track pattern and extending transversely to the direction of the rows, said conductor tracks being shown diagrammatically in FIG. 5 as lines 86 extending in a vertical direction. The conductor tracks 86 constitute a group of substantially straight and parallel signal lines, the collectors or signal outputs of the inverter transistors being situated in their row at the area or location of the crossing of their row and the transversely extending conductor track 86 to which they are connected. The complementary transistors are each arranged near one end of a row of inverter transistors and, viewed in the plan view of FIG. 5, they are present beside or alongside the group of substantially parallel signal tracks 86. The complementary transistors are shown in FIG. 5 by two blocks 87 on either side of the gate circuits, which blocks represent two common emitter zones, the blocks 61 through 85 each denoting a collector zone of the inverter transistors. The actual structure of the semiconductor body of the integrated circuit will be described in detail hereinafter with reference to more detailed drawings, in which it will also become apparent that between adjacent rows of inverter transistors means are present to electrically isolate the inverter transistors which belong to different gate circuits and are present in adjacent rows.

In FIG. 5 the connections between the conductor tracks and the circuit elements are denoted as dots on the lines 86 representing the conductor tracks. The dots to the collectors represented by the square projections are the inverter outputs. The dots to the inverter blocks represent the inverter inputs. It is also shown diagrammatically by dots that the common emitter zones 87 can be replaced by a number of sub-zones, for example, a separate sub-zone for each gate circuit located adjacent the gate under the dot, which are connected together by means of a conductor track 88. On the upper side of FIG. 5, extremities of all conductor tracks are present which form signal inputs or signal outputs for the I²L circuit. In that case the zones 87 and/or the conductor tracks 88 may be connected together, if desired, on the lower side of the Figure by means of a semiconductor zone and/or a conductor track shown by the broken line 89. In arranging the gate circuits, the fact may also be taken into account, if desired, that it may be more advantageous to situate a number of signal inputs and/or signal output on the lower side. If desired, signal inputs and/or signal outputs may also be arranged simply on the left-hand side or on the right-hand side, as will be explained hereinafter.

The topology shown in FIG. 5 is related to the circuit shown in FIG. 4 with the gate circuits 31 through 85 corresponding to the blocks 61 through 85, respectively. With the aid of a computer the gate circuits are arranged so that substantially all the signal lines 86 are straight. In this example, the only exception to this rule is the signal track 90 which connects a signal output of the lower block 64 to the signal output of the block 65 and the signal input of the block 66. Dependent on the circuit to be realized, it may sometimes also be advantageous, however, to divide one or more conductor tracks shown vertically in FIG. 5 between two or more columns, in which the various vertically extending parts of the same electric connection are combined with horizontally extending connection members to form a continuous conductive connection.

Due to the fact that the gate circuits are arranged according to rows and the straight signal conductors are arranged according to columns of a matrix, the topology according to the invention is particularly suitable to use computers in designing the topology of I²L circuits. On the other hand, said topology seems to be contrary to achieving the high switching speed in view. Actually, due to the matrix-wise arrangement of the gate circuits, the base zones will become comparatively long so that the base series resistance, particularly at the coomparatively high current levels which are necessary for higher switching speeds, can have an unfavorable influence on the switching speed. It is already known that in order to achieve a maximum switching speed the emitter of the complementary transistor is preferably arranged as an elongate zone beside the base zone of the associated gate circuit so that the collectors of the gate circuit are all present at equal distances from said emitter zone, which distances moreover are as short as possible. According to this train of thought, the complementary transistors and more in particular the emitter zones thereof must be arranged between the rows of inverter transistors and alternately with said rows.

The invention is inter alia based on the recognition that the train of thought described with respect to the switching speed is not complete and furthermore results in a low effective current amplification factor $\beta$ for the inverter transistors so that the number of collectors which is allowable per gate circuit is restricted. Moreover the practical realization with complementary transistors having elongate emitter zones which are present alternately between adjacent rows of inverter transistors requires much area at the semiconductor surface and also seriously impedes or makes substantially impossible the introduction of a number of other measures to increase the switching speed.

So the invention provides an I²L circuit having a comparatively compact topology which can be designed with the aid of computers and which furthermore presents good possibilities to obtain high switching speeds, without necessarily making a sacrifice at the expense of the maximum admissible number of collectors per gate circuit.

FIG. 6 shows the part of the I²L circuit surrounded in FIG. 5 by the dot-and-dash line 91 in greater detail. FIG. 7 is an associated cross-sectional view taken on the line VII—VII of FIG. 6. As regards the structure of the semiconductor zones and semiconductor regions, said cross-sectional view is essentially comparable to the cross-sectional view shown in FIG. 1. The difference which in the scope of the invention is most important is readily visible in the gate circuit 64. As is usual, this gate circuit is constructed as a multicollector transistor having a common base zone 64, a common emitter zone 92 and a plurality of collector zones 93. The multicollector transistor of the gate circuit 64 is elongated in the direction of the rows so as to arrange the collectors 93 in the correct place under the conductor tracks 90 and 86.

The integrated circuit, for example, has a low resistivity substrate 94 of n-type silicon on which a relatively high resistivity n-type surface layer 95 is present. Present in the silicon surface layer 95 are the common p-type base zones 64, 65, 66 and 82 each comprising one or more n-type collector zones 93. The emitters of the complementary lateral p-n-p transistors have p-type emitter sub-zones 87 which are connected toether by means of a conductor track 88. The conductor tracks 86, 88 and 90 extend via contact apertures shown in dot-and-dash lines to the underlying semiconductor where they form connections with the various semiconductor zones, and also extend over an insulating layer 96 of, for example, silicon dioxide. Between the gate circuits and in this example also between the sub-zones 87, an isolation region 97 is present which extends from the semiconductor surface down to the low resistivity substrate 94 and which is formed, for example, by a low resistivity n-type region.

Due to the regular arrangement of the gate circuits and their signal outputs and due to the signal tracks being for the most part straight, the chosen lay-out of the topology is very well suited for the use of computers in designing specific I²L circuits. In addition, this layout also provides a good starting point as regards the electric performance of the I²L circuit. Of particular importance for reliable operation is the current amplification factor $\beta$ of the inverter transistors. Due to the comparatively unfavorable ratio between emitter junction area and collector junction area, this factor $\beta$ is low. It can be increased by using very small base widths. However this makes the manufacturing process considerably more critical so that the reject rate in mass production will increase considerably. So in practice one would prefer to use other means to ensure a sufficiently large amplification factor $\beta$.

In addition to reliable operation, the switching speed or delay time is also of great importance. Besides the current level, i.e. the value of the current supplied to the gate circuit by the lateral transistor, the switching speed also depends on the location of the collectors relative to the place where said current is supplied to the common base zone. When an inverter transistor is switched on, the capacitances of the transistor and the further capacitances connected to the base of the transistor must be charged. For not too large currents, charging will occur more rapidly according as the presented supply current is larger and the relevant collector of the inverter transistor lies nearer to the point where the presented current reaches the common base zone. When elongated common base zones are used, as is the case in the present example, this reasoning leads to the location of lateral transistors present in the longitudinal direction beside the base zone, i.e., that is between the rows. In the example of FIG. 5, the rows of inverter transistors would have to alternate with strip-shaped emitter zones of the p-n-p transistors present in the direction of the rows. However, this latter topology results in serious problems. For example, it requires more area at the semiconductor surface. Moreover, except at very low current levels, the use of long emitter zones is detrimental for the p-n-p transistors in connection with voltage losses which occur in the emitter zones and which express themselves immediately in the value of the current supplied to the bases of the inverter transistors. In practice it will nearly always be necessary to cover such long emitter zones with a metal layer so as to reduce their series resistance, which in a topology as shown in FIG. 6 having signal tracks extending transversely to the gate circuits will practically automatically require a wiring pattern in two layers or levels which are separated from each other and will hence result in a comparatively complicated manufacturing process. Furthermore, all the common base zones must have the same length, independently of the number of collectors, so as to ensure that the currents supplied to the basees are equally large as much as possible. This also additionally deteriorates the packing density.

Quite a different important problem derives from the required current amplification factor $\beta$ of the inverter transistors. It is found in practice that the factor $\beta$ to a first approximation decreases approximately directly proportionally with increasing inverse current amplification factor $\alpha_{inv.}$ of the lateral p-n-p transistor. The inverse current amplification factor $\alpha_{inv.}$ denotes the current amplification of the p-n-p transistor in the case in which the common base zone of the inverter transistor operates as an emitter and the emitter zone of the p-n-p transistor operates as a collector. According as the common base zone, with its size remaining the same, faces the emitter zone of the p-n-p transistor with a larger part of its edge, the inverse current amplification factor $\alpha_{inv.}$ increases and the current amplification factor $\beta$ of the inverter transistors decreases. This influence of the p-n-p transistor on the factor $\beta$ can be compensated for by increasing the collector surface area of the inverter transistors relative to the emitter surface area with the size of the base zone remaining the same. In practice this results in a series restriction for the number of collectors per base zone and the packing density decreases. An additional important feature is that when the number of signal outputs per gate circuit is reduced, the number of required signal lines increases considerably and hence the wiring pattern becomes considerably more complex. As a practical rule of thumb, the current amplification factor $\beta$ per collector should at least be 1. In the most unfavorable case in which only said collector of the gate is conductive and in addition said collector is the only conductive path for draining away the input current presented to a subsequent gate circuit, each collector of a gate circuit must theoretically sink said input current entirely, while a current of the same value is available as a base current.

This and other considerations on which the invention is also based demonstrate that the chosen lay-out for the topology results in particularly compact, reliably operating I²L circuits in which a reasonable compromise as regards the switching speed is realized. In addition, by adaptation of the transistor structure, the switching speed can be increased, a considerable part of such measures to adapt the structure being practicable in the topology of the invention whereas they cannot be incorporated or can be incorporated with great difficulties only, for example, in the construction having long strip-shaped complementary emitter zones beside the long sides of the common inverter base zones.

In an important preferred embodiment of the I²L circuit according to the invention, the gate circuits have means to reduce the input series resistance. As a result of this the influence of the base current on the emitter-base voltage of the gate circuit is reduced and the current distribution between the collectors of the gate circuit is improved.

As already stated, the influence of the base-series resistance of the gate circuit on the switching speed can be reduced by using elongate emitter zones for the complementary transistors which are arranged along the long side of the common base zone of a gate circuit. However, this applies only during the charging of the base-emitter and base-collector capacities when the inverter transistors change from the non-conductive into the conductive state. When the inverter transistors are switched in the opposite direction from the conductive into the non-conductive state, the necessary decrease of the emitter-base voltage depends at least to a considerable extent on and is determined by the current flowing via the base connection—so via the input series resistance of the gate circuit. Therefore, the reduction of the input series resistance is a more effective measure to increase the switching speed.

Moreover, the above mentioned choice influences the effective current amplification factor $\beta$ of the inverter transistors. Starting from the super-position principle the net current supplied to the common base zone of the inverter transistors of a gate circuit via the complementary transistor which is in saturation, may be considered as the difference between a forward current flowing from the emitter to the collector of the complementary transistor and a backward current. Viewed from the inverter transistors, the last-mentioned backward current may also be interpreted as a base loss current. Said loss current becomes larger according as a larger part of the edge of the common base zone faces the emitter zone of the complementary transistor. The effective current amplification factor $\beta$ of the inverter transistors thus proves to decrease substantially directly proportional to the increase of the current amplification factor in the inverse direction $\alpha_{inv}$ of the complementary transistor.

The effective current amplification factor $\beta$ is of importance for the maximum number of collectors which may be used per gate circuit. Actually, starting from the fact that every collector output of a gate circuit must be capable of sinking the supply current supplied to the input of the subsequent gate circuit connected to said output, while at the input of the first mentioned gate a current of the same value is available as the base current, it follows that each gate circuit must have a current amplification factor $\beta$ of at least 1 per collector. In a gate circuit which consists of a multicollector transistor, only one of the collectors conveys current in the most unfavorable case. For this collector current also it should still hold that the current amplification factor $\beta$ is at least 1. This most unfavorable situation will seldom or never occur in practice. The less stringent requirement, that the current amplification factor of a multicollector transistor has at least a value which is equal to the number of collectors of said transistor, is therefore often sufficient.

According to the invention important advantages are realized when the complementary transistor is situated beside the group of signal lines independently of the place of the collectors of the relevant gate circuit. In addition to other advantages which will be described hereinafter, it is inter alia achieved with this measure that the complementary transistor can more easily be optimized and be made relatively small so that the influence on the amplification factor $\beta$ of the inverter transistors is reduced and the topology of the I²L circuit becomes more compact. Moreover, notably the dimensions of the emitter of the complementary transistor may then simply be chosen to be so small that at the desired current level the emitter-base voltage of the complementary transistor is so large that a sufficiently large voltage swing is available to bring the emitter-base junction of the inverter transistors into the conductive state.

In a simple preferred embodiment, the desired comparatively low input series resistance is obtained by using a base zone which is common to the inverter transistors of one gate circuit and has a strip-shaped base sub-zone which is preferably comparatively low resistive and extends in the direction of the row, which strip-shaped sub-zone bounds and adjoins one or more preferably comparatively high resistance base sub-zones in which the collectors of the gate circuit are present. The strip-shaped comparatively low resistance base sub-zone extends in the direction of the row along all the collectors and forms a low-ohmic connection for the supply of the base current received via the complementary transistor preferably present near one end of the base zone to the active parts of the gate circuit, namely the parts which are present in the immediate proximity of the inverter collectors and in which transistor action occurs in the conductive state. Conversely, upon switching off, sufficient current to reduce or decrease the emitter-base voltage rapidly to the desired level can comparatively easily flow via said low-ohmic connection.

The common base zone of the gate circuit preferably is in the form of a rake or comb, in which the strip-shaped low resistance base sub-zone forms the ridge or base of the rake or comb and in which on one or both sides of the ridge of the rake or comb one or more smaller high resistance base sub-zones extend from said ridge as teeth or digits, which high resistance base sub-zones each comprise one collector of the gate circuit. A particularly compact structure can be realized with such rake-shaped base zones.

An important measure within the scope of the invention is the use of means to reduce the imput series resistance of the gate circuits. One of the possible embodiments is shown in FIGS. 8 and 9 which show the same part of the BCD-six counter denoted in FIG. 5 by the block 91, but this time in an adapted or modified construction. Shown are the gate circuits 65 and 66 and a part of the gate circuits 64 and 82. The adaptation is based inter alia on the recognition that in the structure shown in FIGS. 6 and 7 the input or base series resistance for the inverter transistor present farthest from the signal input contact, so for the collector which is farthest remote, is also high because the current in the common base zone therefore must first flow along collectors situated nearer, so through comparatively narrow passages. This can be prevented, for example, by using a comb structure. In FIG. 8, the common base zone 66, for example, has a strip-shaped base sub-zone 98 extending in the direction of the rows and adjoining a plurality of base sub-zones 99 each comprising preferably only one collector 93 of the gate circuit. The strip-shaped base sub-zone 98 is preferably occupied substantially entirely by a more highly doped region which has a higher doping concentration than and hence is comparatively low resistance relative to at least the parts of the base sub-zones 99 covered by the collectors. The strip-shaped base sub-zone 98 forms a low-ohmic connection which extends as the ridge of a comb or rake along all the collectors of the gate circuit, while the active parts of the gate circuit, that is to say the parts in which during operation transistor action occurs, adjoin the ridge of the rake or comb as teeth.

The resulting low input series resistance has important advantages. First of all, the current supplied by the lateral p-n-p transistor near the end of the gate circuit can readily reach also active parts of the gate circuit which are situated farther away, so that upon switching to the conductive state the transistor capacitances can rapidly be charged and hence the switching speed is increased. As such, the strip-shaped base sub-zone constitutes an alternative for the above mentioned use of strip-shaped p-type complementary emitter zones placed alternately between the rows. However, the said indicated alternative solution is moreover more effective. Upon switching to the non-conductive state, withdrawal of current via the base contact occurs and the potential of the common base zone adapts correspondingly. In this connection it is of advantage that all the active parts of the gate circuit are connected to the base contact via the strip-shaped base sub-zone in a comparatively low-ohmic manner. Thus the reduced input series resistance also provides an improvement of the switching-off time. The fact that, due to the arrangement of the complementary transistors, the factor $\beta$ of the inverter transistors is comparatively high also contributes to said improved switching-off time. As a matter of fact, as a result of said higher $\beta$, the preceding inverter transistor can more readily drain the current to be derived via the base contact.

A further advantage of the rake-shaped structure is that the input contact with one of the output contacts can be situated substantially in one line in a direction transverse to the direction of the rows, this in contrast with the embodiment shown in FIG. 6. As a result of this, the topology becomes more compact in the direction of the rows. The space required transverse to the direction of the rows can be restricted by arranging the rake-shaped gate circuits so that they suitably interdigitate, such as for example the gate circuits 65 and 66 in FIG. 8. The expression that the teeth of the rake-shaped gate circuits interdigitate means only that adjacent gate circuits are arranged so closely together that, at the height of a given signal track, between the gate circuits, only sufficient space is available to provide one of two adjacent gate circuits with a tooth. It will be obvious, however, that not all the positions available for teeth need actually also be occupied, while it is also shown in FIG. 8 that adjacent teeth, for example, need not necessarily belong alternately to different gate circuits.

By providing at the end of the gate circuits an L-shape as is shown in FIG. 8, the p-n-p transistor can be adapted to the desired current level and/or the current density which is deemed admissible. The L-shaped end portion of the common base zones and the oppositely located emitter zones 87 of the p-n-p complementary transistors have, at the semiconductor surface, preferably substantially the same comparatively high doping concentration as the strip-shaped base sub-zone 98.

In the present example also, the circuit elements are provided in a comparatively high-ohmic or resistance surface layer 95, the common emitter zone 92 comprising a comparatively low-ohmic part 101, for example, in the form of a buried layer, in addition to a part of the surface layer 95. In this case the substrate 102 is of the opposite conductivity type, so of p-type material.

In the example shown in FIGS. 8 and 9, an isolation region 100 of insulating material is furthermore used instead of a low-ohmic semiconductor isolation region. This provides a better electrical separation and in addition the surface of the emitter-base junction is reduced by eliminating the parts extending transversely to the semiconductor surface. Both improvements have a favorable influence on the current amplification factor $\beta$, and the switching speed is additionally increased because the emitter-base capacitance is reduced by the last mentioned improvement. When an isolation region consisting of insulating material is used, a further reduction of the geometries can be achieved, as is described in the following example. The integrated circuit becomes considerably more compact so that much less space is necessary at the surface of the semiconductor body. In particular, the use of complementary transistors situated beside the signal lines and the use of rake-shaped gate circuits enable a compact structure in which the surface of the p-n junctions is comparatively small so that the depletion capacitances and charge storage capacitances are small and the current amplification factor $\beta$ is comparatively large, while on the other hand series resistors which can detrimentally influence the current distribution are nevertheless avoided.

In an important preferred embodiment of an I$^2$L circuit according to the invention, at least the high-ohmic base sub-zones consist of parts of the surface layer which, by local doping, have been converted from the first into a second opposite conductivity type throughout the thickness of the surface layer, so the high-ohmic base sub-zones extend from the surface down to the low-ohmic region of the first conductivity type.

In this manner the charge storage which takes place in the conductive state at the emitter-base junction of the inverter transistors is reduced and substantially restricted to charge storage in the base zone.

An approach which looks less purposeful because the inverter transistors in the conductive state are in saturation so that both the emitter-base junction and the collector-base junction are in the forward direction, but which nevertheless is important and advantageous within the scope of the invention, is the inversion of the doping profile at least in and preferably also only in the high-ohmic base sub-zones. In the known I²L circuits the base zone of the inverter transistors has a doping profile in which the doping concentration, proceeding from the emitter-base junction to the collector-base junction, increases at least for the most part. An inverted profile, so decreasing from the emitter to the collector, provides a smaller charge storage at the same collector current, assuming the value of the volume integral of the base doping is equal in both cases. Although both the emitter-base junction and the collector-base junction are in the forward direction and charge storage hence occurs in the base zone at both junctions, the emitter-base junction has the largest surface area as a result of the inverse transistor structure, while in addition the forward voltage across said junction is always larger than that across the collector-base junction in saturation.

In the low-resistance base sub-zone, so the non-active part of the base zone, the doping profile is preferably not inverted and the doping concentration preferably decreases in a direction from the surface inward to the emitter-base junction at least mainly and in particular in the part present nearest to the surface. No transistor current need flow in said low-resistance part of the base zone and therefore the current injected across the emitter-base junction can be restricted by increasing the doping concentration, at least the volume integral thereof. This improves the current amplification factor $\beta$ of the inverter transistors. This increase of the volume integral of the doping is preferably achieved without the concentration at the p-n junction being increased. An increased concentration at the p-n junction would cause an increase of the depletion capacitance of the junction so that the product of dissipation and delay time would become less favorable. Just with a doping profile which decreases towards the emitter-base junction can the overall quantity of doping be considerably increased without the depletion capacitance being increased.

As already stated, an electric separation is provided between the rows of inverter transistors. As in the known I²L circuits, said separation may be obtained by means of a low-ohmic zone of the first conductivity type which from the surface extends through the surface layer substantially down to or into the low-ohmic part of the first conductivity type which belongs to the common emitter zone and extends below the base zones. In an important preferred embodiment of an I²L circuit according to the invention, this electric separation which surrounds the base zones of the inverter transistors as much as possible, is obtained by means of a form of dielectric isolation. This means a form of isolation which is not based on the presence of internal semiconductor junctions. Dielectric isolation can be realized, for example, in the form of air isolation and/or grooves in the surface layer whether or not covered and/or filled with insulating material or in the form of a pattern of insulating material sunk or inset in the surface layer at least over a part of its thickness and obtained by local or selective oxidation. Not only can the surface area of the emitter-base junction of the inverter transistors be reduced with this kind of dielectric separation which preferably extends in the semiconductor body at least down to the same depth as the base zones, since the parts thereof extending transversely to the surface are eliminated, but also the inverter transistors as a whole can also be constructed to be smaller in this type of isolation. As a result of this, this kind of isolation provides an important contribution to the desired increase of the switching speed.

For clarity it is stated again that this form of isolation can be used without drawback and without, for example, the base-series resistance being considerably increased, only because in the topology according to the invention the complimentary transistors are arranged preferably near the ends of the rows of transistors and the base current flows in the direction of the rows to the active parts of the inverter transistors.

In another preferred embodiment the signal input of the gate circuit consists of a number of base sub-zones which are separated from each other and each preferably comprise only one collector of the gate circuit, which base sub-zones are connected together by means of a conductor track extending in the direction of the row, the base sub-zones extending down to below said conductor track and being connected thereto via apertures in the insulating layer. In this case the means to reduce the input resistance are formed at least mainly by the said conductor track. In this case also, the collective area of the emitter-base junctions of the inverter transistors of the gate circuit is comparatively small. This small junction area has a favorable influence on the amplification factor $\beta$ of the inverter transistors. Moreover the depletion capacitances and charge storage capacitances are also comparatively small, which is in favor of the switching speed.

This following example, which illustrates the foregoing features, like the preceding one, is based on the topology shown in FIG. 5. This further embodiment of an integrated circuit according to the invention will be described with reference to FIGS. 10, 11 and 12 in which the more detailed plan view of FIG. 10 corresponds to the parts of the BCD-six counter surrounded in FIG. 5 by a dot-and-dash line 110. Concerned are the gate circuits 74, 84, 85 and 83. The structure of the gate circuits in this case also is in the form of a rake or comb, the teeth of each two combs in this case always facing each other and interdigitating. The teeth which comprise the collectors of the inverter transistors are situated immediately below the relevant one of the conductor tracks 86 to which they are connected and which extend transversely to the rows.

The integrated circuit has a semiconductor body 111 which has a p-type substrate 112 of, for example, silicon having a resistivity of approximately 5 Ohm.cm and a surface layer 113 which consists, for example, of an n-type epitaxial layer of silicon having a resistivity of approximately 0.5 Ohm.cm and a thickness of, for example, 1 to 1.5 $\mu$m. A considerable part of the epitaxial layer is converted into insulating material in known manner by local oxidation. The insulating material inset in the surface layer 113 at least over a part of its thickness forms a pattern 114 which serves as the already mentioned isolation region.

The gate circuits have rake-shaped p-type base zones 116, the teeth of the rake-shape comprising n-type collector zones 117. Beside the group of signal conductors 86 and near the ends of the strip-shaped ridges of the comb- or rake-shaped base zones there is an n-type region 118 which serves as a base zone for the complementary lateral p-n-p transistors. In this region 118 there is present a p-type emitter zone 87 between every two gate circuits of which the teeth of the comb-shaped base zones 116 face each other. The emitter zones 87 are connected to a conductor track 88 which extends parallel to the signal tracks 86. The collectors of the lateral p-n-p transistors are formed by substantially parallel parts of the comb-shaped base zones 116 of the gate circuit and which extends alongside the emitter zones 87 (FIG. 11). In this example the rake-shaped gate circuits always comprise teeth only at one of the long sides of the ridge. The base zones 116 of the gate circuits 84 and 85 extend to beyond the conductor track 88, it being shown at the left side of FIG. 10 that they may be provided there with electric connections which may be used as signal inputs. In FIG. 10 all the n-p-n collectors 117 are situated on the right-hand side of the conductor track 88 and the input and output signals can be derived and supplied, respectively, at the upper side of the figure. However, by extending one or more relevant base zones to, in this case, the left-hand side of the conductor track 88 and providing them there with a collector zone, output signals can also be derived on the left-hand side. Which configuration will be used will frequently depend on the remaining part of the integrated circuit and notably on the location where the input signals become available and the place(s) where the output signals are necessary. It is obvious that the conductor track 88 and the lateral p-n-p transistors need not always be present at the end of the elongate gate circuits. The p-n-p transistors are always situated so that they are present beside a group of substantially parallel signal tracks 86 or between two of the said groups and are connected to at least one row of inverter transistors connected to said signal tracks, which row extends substantially transversely to said signal tracks. The inverter transistors of the gate circuits may also be arranged on either side of the conductor track 88 and the lateral p-n-p transistors. In both cases, however, the current supplied to the base zones of the inverter transistors via the lateral transistors, after having been collected by the p-type collector zone of the lateral transistor, flows in a direction transverse to the signal tracks 86 to the place where it is needed for the operation of the inverter transistors.

The collector zones 117 and the teeth of the base zones 116 are surrounded on three sides by the isolating pattern or separation region 114. As a result of this configuration, the surface of the emitter-base junction of the inverse vertical inverter transistors and in particular also the surface of the base-collector junction of said transistors is comparatively small. The depletion and charge storage capacitances associated with said p-n junctions are hence also comparatively small so that the switching speed is comparatively large.

As already stated, an n-type epitaxial layer 113 is deposited on the p-type substrate 112. Before providing said n-type layer, the substrate is provided with an n-type doping to form an n-type buried layer 115 consisting of one or more parts. This buried layer has, for example, a sheet resistance of approximately 25 Ohm per square. Arsenic or antimony may be used as the doping element. At the locations where the n-p-n inverter transistors are to be provided, a p-type doping is also provided in the substrate, the quantity and the diffusion coefficient of the relevant doping element being chosen to be so that after growing the epitaxial layer and the further heat treatments necessary for the manufacture of the integrated circuit, the p-type doping provided locally in the substrate has diffused-out toward the surface and into the epitaxial layer over such a distance that the parts of the original n-type epitaxial layer present above said locally p-doped regions are converted into p-type zones substantially entirely, that is to say, at least up to the place where the collector-base junction of the inverter transistor is present or will ultimately be present and preferably entirely up to the surface of the surface layer 113. For this purpose, for example, boron may be used as the p-type impurity. The sheet resistance of said p-type zones obtained by over-doping is, for example, approximately 5 kOhm per square. In this manner, p-type parts 119 belonging to the base zones 116 are obtained having a doping profile in which the p-type impurity concentration decreases from the p-n junction formed with the buried layer 115 in the direction towards the surface of the surface layer and the base-collector junction at least after a certain (short) distance. Such parts 119 having an inverted doping profile may also be obtained by means of ion implantation.

The n-type collectors 117 are provided in the out-diffused parts 119 of the base zone 116. In the remaining part of the p-type region 119 not covered by the collectors 117 a higher doping is provided from the surface. This more highly doped p-region or part 120 preferably does not touch the collector zones 117, while the relevant doping treatment is moreover preferably carried out so that near the p-n junction formed with the buried layer the p-type impurity concentration already present at said location after the formation of the region 119 is not increased or is increased only to a small extent. The emitter zones 87 and the collector zones of the lateral p-n-p transistors can be formed simultaneously with the more highly doped p-parts 120.

If necessary, a p-type channel stopper 121 may be used in the base zone 116 along the edges of the insulating pattern 114. Such a p-type doped zone 121 can be obtained in known manner by means of an extra mask and, for example, a doping treatment preceding the local oxidation for the formation of the pattern 114. For example, boron is diffused having a sheet resistance of 100 to 150 Ohm per square. The extra mask is superfluous when the channel stopper is also used in the part 118 of the surface layer in which the lateral p-n-p transistors are present. When the two p-type zones of the p-n-p transistors adjoin the pattern 114, they will be connected together by the p-type channel stopper. Such a short-circuit can be removed with a local, deep n-type diffusion along the edge of the pattern 114 between the emitter and the collector of the p-n-p transistor. The p-n-p transistor may also be constructed in these circumstances with an annular emitter or collector. In that case, the deep n-type diffusion to prevent emitter-collector shorts may be omitted. However, comparatively much area will be necessary at the surface for the annular p-n-p transistors.

When the n-type buried layer 115 consists of two or more parts 122 and 123 which are separate from each other, the channel stopper 121 may also extend below the insulating pattern over such a distance that undesired channel formation between the buried layers 122 and 123 is also prevented.

One of the advantages of the use of a region 119 having an inverted doping profile is that no channel stopper 121 to prevent an emitter-collector short-circuit is usually necessary in the base zone 116. In this case, if a continuous and coherent buried layer 115 is used, one operation can be saved. When the buried layer 115 consists of several parts 122 and 123, a channel stopper may be provided between said parts by providing the whole surface layer of the substrate with a higher doping concentration prior to providing the epitaxial layer.

Another possibility is to locally increase the surface concentration in the substrate between the parts of the buried layer with the aid of a negative image of the pattern of the buried layer.

In the active part 119 of the inverter base zone present between the emitter-base junction and the collector-base junction, in which part during operation the transistor action mainly occurs, there is hence present a doping profile which provides an aiding drift electric field for the minority charge carriers injected by the emitter and crossing the base zone. Another important advantage of said doping profile, however, relates to the storage of charge in the transistor. In the conductive state the inverter transistor is in saturation, both the emitter-base junction and the collector-base junction being in the forward direction. Storage of minority charge carriers takes place at both junctions and that mainly in the base zone because the emitter zone and the collector zone both have a higher doping concentration than the base zone. One of the advantages of the use of a base zone which adjoins the buried n-type layer and in which thus the surface layer is practically entirely converted into p-type material by overdoping is that the storage of charge is concentrated substantially entirely in the base zone. In the conductive state the forward voltage across the emitter-base junction will always be larger than that across the collector-base junction, while in addition the surface of the emitter-base junction is in most of the cases larger than that of the collector-base junction. As a result of this, the emitter-base junction is more important than the collector-base junction as regards the storage of charge. Since the charge storage capacitance decreases when the doping concentration increases, a doping profile which is higher at the emitter side than at the collector side will provide less charge storage at a given current level than a doping profile which is low at the emitter side and high at the collector side assuming the quantity of doping impurities in the active parts of the base zone to be equal in both cases. This reduced charge storage favors a higher switching speed of the inverter transistors. In this case it has been presumed that the quantity of dopants in the active part of the base zone is not chosen to be larger than is usual for planar transistors. This restricted quantity of doping with the profile described will result in a concentration at the emitter-base junction with which a reasonable compromise is obtained between the value of the charge storage capacitance which is smaller according as the concentration is higher and the value of the depletion capacitance which is smaller according as the concentration is lower.

In the remaining, so the non-active, part of the base zone a highly doped p-type region 120 is provided in which the volume integral of the doping concentration, taken per surface unit, is considerably larger than in the active part of the base zone. For clarity it is stated that the said unit of surface is assumed to be parallel to the one side of the semiconductor body which is the top major surface in FIG. 10. Besides for contacting purposes, said region also serves to increase the current amplification factor $\beta$. The larger the quantity of dopants in said part 120 of the base zone, the fewer charge carriers will be injected across the adjacent part of the emitter-base junction. In this non-active part of the base zone a doping profile is to be preferred which is lowest at the emitter-base junction because in that case the quotient of the volume integral of the doping and the volume for the more highly doped region can be chosen to be considerably larger than for the active part of the base zone without it being necessary for the concentration at the base-emitter junction in said parts to be different. Thus, in the non-active part of the base zone the same compromise between the values of the depletion capacitance and the charge storage capacitance can also be realized as in the active part.

The speed of the I²L circuit can further be improved by replacing the strip-shaped parts 116 of the base zone which are occupied substantially entirely by the more highly doped region 120 by conductor tracks as much as possible. As a result of this the input series resistance of the gate circuits usually will be reduced, and, moreover, the emitter-base capacitance of the inverter transistors will also be reduced considerably and the current amplification factor $\beta$ of said transistors will be increased. In plan view, this variation looks substantially the same as the preceding one.

In FIG. 10, contact windows in the insulating layer of layers 125, 126 present on the semiconductor surface are denoted by squares and rectangles shown in broken lines. In the already described first embodiment, so the embodiment in which the ridges of the rake-shaped gates are constructed as strip-shaped p-type zones, the contact apertures denoted by an X are present. In the faster variation the rake-shaped gate circuit consists of a number of, in this case rectangular, base zones each having one collector 117, the parts or sub-zones of said base zones which comprise the more highly doped regions 120 being connected to a strip-shaped conductor track 128 (FIG. 13) which extends in the direction of the rows and which forms the ridge of the rake. The base zones are separated from each other and are arranged as the teeth of the rake transversely to the ridge, the collectors in each base zone, preferably not more than one, being situated beside the conductor track 128. The base zones extend in the semiconductor body to below the conductor track 128 and, via apertures in the insulating layer 125 present below the track 128 and via the track 128, are connected together and to the collector zone of the associated complementary transistor. In this embodiment also the contact apertures of FIG. 10 not denoted with an X are present. FIG. 13 is a cross-sectional view of this faster embodiment corresponding to FIG. 12. Each of the gate circuits has a conductor track 128 which connects a collector 124 of a lateral transistor to one or more small inverter base zones surrounded by the insulating pattern 114. The conductor track 128 is insulated from the signal tracks 86 and the conductor track 88 by an insulating layer 126.

It will be obvious that the possibility of making the buried layer 115 consist of several parts which are separated from each other and which are electrically isolated from each other is of importance inter alia for integration in the same semiconductor body of other parts of the circuit. Such other parts may be but need not be constructed in I²L technology. For example, they may be input and/or output circuits with which an adaptation of the signal level is obtained, so-called interface circuits. For example, an input circuit may be used which can be driven with signals originating from, for example, TTL circuits in which the signal level and the signal value are converted into values which are suitable for I²L gate circuits and a circuit may be used at the output(s) which again transforms the signals to values which are suitable for driving TTL circuits. Such circuits and other circuits which are or are not constructed in I²L technology, can simply be provided in separate isolated parts of the epitaxial layer and in the same semiconductor body in a usual manner. Sometimes, the same inverse transistors may be used advantageously in the part which is not constructed in I²L technology. In the last described example the inverter transistors surrounded entirely by insulating material are high speed transistors, due to their minuteness and the adapted doping profile, in spite of the fact that they are operated in saturation. With said inverse transistors, for example, TTL circuits can be realized in the same semiconductor body which, without extra diodes, are comparable in speed with the high speed TTL circuits which are often referred to as "Schottky-TTL".

However, for the I²L circuit itself this possibility is also of advantage. So far, a number of measures and possibilities to improve mainly the inverter transistors have been described. In the first instance indeed especially the inverter transistors are decisive of the switching speed. However, the lateral transistor also influences the switching speed. During operation said transistor also is in saturation, the collector voltage following the logic input signal of the relevant gate circuit. As a result of this, the collector-base voltage of the lateral transistor varies regularly, in which the quantity of stored charge which is mainly present in the base is always varied also. In all such embodiments, said charge storage in the lateral transistor also influences the switching speed. According as the inverter transistors are improved as regards the switching speed, the influence of the lateral transistor increases relatively.

According to the invention, the charge storage in the lateral transistor can be decreased by means of a potential difference between the base of the lateral transistor(s) and the common emitter of the inverter transistors. With a suitable potential difference it can be prevented that the lateral transistor goes deep into saturation when the inverter transistor connected to the collector is in the conductive state. A possible embodiment is shown diagrammatically in FIG. 14. Two I²L gate circuits 131 and 132 are represented by multicollector inverter transistors 133 and 134, respectively, the bases of which are connected to a collector of complementary transistors 135 and 136, respectively, for the supply of bias current. A resistor 137 is provided between the base of the complementary transistor 135 and the interconnected emitters of the inverter transistors. The resistor 137 is preferably proportioned so that a potential difference of at least 30 mV and better even of more than 60 mV arises across the resistor 137 at the current level desired for the I²L circuit. Moreover that potential difference is preferably not larger than 500 mV and in many cases not larger than approximately 300 mV because therewith the favorable effect in view is reached for the greater part and a further increase of the potential difference usually provides too little improvement to justify the dissipation which likewise becomes larger. A very practical value for the potential difference is, for example, 200 to 300 mV. When the current to be supplied to the gate circuit 133 is, for example, approximately 1 mA and the current amplification factor $\beta$ of the lateral p-n-p transistor 135 is, for example, approximately 10, then the base current of the transistor 135 is approximately 100 $\mu$A. A suitable value for the resistor 137 is ten approximately 2.5 k.Ohm. In particular because the transistor 135 will usually be a lateral transistor the current amplification factor of which generally depends not inconsiderably on the manufacturing conditions, a more accurate adjustment will usually be obtained if a diode is connected parallel to the emitter-base junction of the p-n-p transistor 135. This can simply be realized by constructing the p-n-p transistor 135 as multicollector transistors, one of the collectors being short-circuited, as is denoted by the broken line 138, with the base of the transistor. The ratio between the current flowing through the resistor 137 and the current supplied to the inverter transistor 133 is now fixed to a considerable extent by the ratio of the collecting surface area of the collector short-circuited to the base which faces the common emitter and the collecting surface area of the collector connected to the inverter transistor. When said geometric ratio is, for example, 1 to 2, approximately 500 $\mu$A flows through the resistor 137 at the desired collector current of 1 mA. The resistance value is now chosen to be approximately 500 Ohm. This applies notably when the factor $\beta$ is high. At lower $\beta$'s, the base current of the lateral transistor which actually also flows through the resistor, should also be taken into account.

A connection 139 is shown between the emitters of the complementary transistors 135 and 136. Also a connection 140 is present between the bases of said transistors 135 and 136. The transistors 135 and 136 can hence be constructed collectively as one multicollector transistor, the resistor 137 being common to both transistors 135 and 136. This common adjustment of the base potential of the transistors 135 and 136 will operate readily in particular when the series resistances in the connections 139 and 140 are small. Also because the current distribution across the I²L circuit is sensitive to series resistance in the connection 139, it is recommended to combine the adjustment of the base potential of the complementary transistors only for gate circuits situated closely together and separately adjust the thus formed groups of closely arranged gate circuits. This has the additional advantage that a voltage loss in the supply line occurring between two groups is compensated for to a considerable extent by the voltage occurring across the adjusting resistor 137 so that the current distribution as a whole becomes more uniform.

It is to be noted that instead of the resistor 137 any other suitable impedance element, schematically represented by block 165 (FIG. 14), may be used in the electric connection between the emitter(s) of the inverter transistors and the base zone(s) of the associated complementary transistors, with which the desired potential can be obtained. For example, in combination with resistor 137 or instead of resistor 137 block 165 may comprise a Schottky diode which also may be used readily for that purpose. FIG. 14A shows block 165 comprising a Schottky diode 166. A voltage may also be applied externally to the bases of the complementary transistors via an extra connection which is shown diagrammatically in FIG. 11 and is referenced 161.

FIGS. 15 through 18 show how the adjustment of the base potential of the lateral complementary transistors can be realized, for example, in an embodiment derived from the embodiment shown in FIGS. 10 and 13. Corresponding parts are referred to by the same reference numerals. FIGS. 15 through 18 only show the part of the integrated circuit corresponding to the part shown on the left-hand side in FIG. 10. This part comprises the lateral p-n-p transistors. The right-hand part which comprises the inverter transistors of the gate circuits is substantially the same for both embodiments.

The semiconductor body 151 comprises a p-type substrate 112 and an n-type surface layer 113 which is subdivided by means of a pattern 114 of insulating material. Gate circuits are provided in the surface layer 113 in the manner described with reference to FIG. 13, the p-type base zones of the inverter transistors of each gate circuit, which transistors have their emitter-base junctions connected in parallel, being connected together and to a collector 124 of a lateral p-n-p transistor by a conductor track 128.

The n-type buried layer 115 consists of various parts, namely a part 123 which is common to the or a part of the inverter transistors and a number of parts 122 which are each common to a group of p-n-p transistors the base potential of which is adjusted in common. The parts 122 and 123 are separated from each other by channel stoppers 121.

The p-type emitter zone 87a connected to the supply line 88 is present opposite to two p-type collector zones 124 which are each connected to the base zones of the n-p-n inverter transistors of one gate circuit and in addition opposite to a third collector zone 152. The edge of the third collector zone 152 facing the emitter zone 87a has, for example, approximately half the length of that of the collector zones 124, so that this third collector zone 152 during operation will convey a current which is approximately half of the current which flows through each of the collector zones 124. Other current ratios can simply be realized in a corresponding manner.

Beside the third collector zone 152 there is an n-type region 153 which is more highly doped than the adjoining n-type part 118 of the surface layer 113. The region 153 may be provided, for example, simultaneously with the collector zones of the inverter transistors. The p-n junction between the zones 152 and 153 and hence the p-n junction between the third collector zone 152 and the common base zone 118, 122 is short-circuited at the surface with a conductive layer 155 which is connected to the semiconductor surface through an aperture 154 in the insulating layer 125.

Adjoining the third collector zone 152 is a p-type resistance zone 156. The resistance zone 156 adjoins the same n-type region 118 to which also the emitter zone 87a and the collector zones 124 and 152 adjoin. These zones are moreover present above the same continuous part 122 of the buried layer. FIG. 16 shows diagrammatically the lateral boundary of said part 122 of the buried layer. Dependent on the fact whether the adjustment of the base potential to be obtained with the resistor 156 must serve only for the two p-n-p transistors shown in FIG. 15 as the uppermost ones or simultaneously also for the lower two p-n-p transistors, said lower two p-n-p transistors are provided in an analogous manner with a diode and a resistor, respectively an extension of the buried layer part 122 as denoted by the broken line 157 in FIG. 16 will suffice. In the latter case, all the lateral p-n-p transistors shown in FIG. 15 have a common base zone 118, 122, 157. Said p-n-p transistors together constitute a group having a common adjustment for the base potential.

In the part of the integrated circuit present on the right-hand side of the p-n-p transistors in FIG. 15, the inverter transistors of the gate circuits are situated. The common emitter zone of said inverter transistors is formed by the n-type buried layer part 123. The part of the surface layer 113 present above said part 123 comprises p-type base zones 116 (see FIG. 11) consisting of a part 119 which is present between the emitter 124 and the collector 117 and has a doping profile in which the doping concentration proceeding from the inverter emitter to the collector decreases and a more highly doped part 120 which preferably has a doping profile such that the concentration decreases at least mainly in the opposite direction. For the rest, said part of the surface layer 112 is occupied substantially entirely by the insulating pattern 114.

Differing from the example shown in FIGS. 10 and 13, a strip-shaped n-type region 158 is present in the present embodiment between the gate circuits 84 and 85 which extends in the direction of the rows of the inverter transistors and hence transversely to the signal tracks 86. Said n-type region 158 consists of the original n-type material of the surface layer 113 and a more highly doped n-type surface zone 158a in which the doping concentration is hence larger than the original doping concentration of the surface layer and being provided at the semiconductor surface simultaneously with the provision of the collector zones 117. A deep more highly doped zone 158a which extends down to the buried layer 123 may also be used. The strip-shaped region 158 belongs to the common emitter zone of the inverter transistors and serves inter alia to reduce the series resistance in said emitter and to prevent the occurrence of or at least to reduce undesired potential differences in the common emitter zone. The rows of inverter transistors are preferably distributed between a number of groups each comprising at least two rows, a strip-shaped surface region 158 extending between adjacent groups of rows and being separated from the adjoining rows of inverter transistors by the pattern 114 of insulating material.

Via windows 159 in the insulating layer 125 and a conductive layer 160, the end of the resistance zone 156 remote from the third collector zone 152 is connected to the surface zone 158a and hence to the n-type region 158 and the common n-type emitter of the inverter transistors. Therewith, the resistance 156 is connected in accordance with the circuit diagram shown in FIG. 14.

If desired, the conductive layer 160 may continue in the direction of the rows across and in contact with the whole strip-shaped region 158 so that a further contribution to the reduction of the resistance in the common emitter and a better equality of the emitter series resistance of the various inverter transistors can be obtained. The conductor track 160 is separated from the supply line 88 by the insulating layer 126.

The resistance zone 156 and the third collector zone 152 may be obtained, for example, simultaneously with the highly doped parts 120 of the bases of the inverter transistors. In choosing the resistance value of the resistor 156, in particular when the current amplification factor $\beta$ of the p-n-p transistors is not too large, the fact will have to be taken into account that not only the current collected by the third collector zone 152 but also the overall base current of the group of p-n-p transistors with commonly adjusted base potential flows through the resistor.

The common emitter(s) of the inverter transistors may be provided at the one side in the usual manner with one or more electric connections which are denoted diagrammatically in FIGS. 11 and 18 by 162. In the embodiment shown in FIGS. 15 through 18 a conductive connection 167 (FIG. 15A) extending transversely to the direction of the rows is preferably present and connects the strip-shaped n-type surface regions 158 extending in the direction of the rows together and to the electric connection 162. Said conductive connections are preferably situated near the ends of the gate circuits so that an interdigital pattern is obtained which is formed on the one hand by the conductor track 88 and the ridges of the gate circuits and on the other hand by the surface regions 158 and their conductive connection. A further embodiment of an integrated circuit according to the invention and comprising several interconnected logic I²L circuits could have a lay-out, a left-hand part of which corresponds to FIG. 15 showing the current supply for the gate circuits 128. In this further embodiment the gate circuits 128 extend to the right as far as necessary to provide for the signal tracks 86. Alongside the right-hand side of the group of signal tracks 86 a conductive connection 167 extends parallel to the signal tracks as shown in FIG. 15A. In this example the connection 167 is a conductor track provided on the insulating layer. It connects the surface regions 158 to each other and to the connection 162 and thus belongs to the common emitter of the inverter transistors. This conductive connection also may be constituted by a strip-shaped n-type surface region similar to the regions 158 or may comprise one or more of such strip-shaped regions. In the example shown the interdigitated pattern comprises two ridges 128 for every surface region 158.

The p-type substrate 112 is also provided with an electric connection 163 shown diagrammatically (FIGS. 13 and 18).

The invention is not restricted to the embodiments described. Many variations are possible to those skilled in the art without departing from the scope of the invention. In the examples, the current supply of the gate circuits comprises, for example, a complementary transistor which forms a three-layer current injector. In the said Dutch Patent Application No. 71.07040 current injectors other than three-layer current injectors for use in I²L circuits are described. Said other current injectors which may have more than three layers, may also be used advantageously in the integrated circuit according to the invention. The output circuits described in the said Application can also be combined simply with the embodiments described.

In the present application a number of measures to improve the known I²L circuits are described which each provide their contribution. Notably the potential difference between the common emitter of the inverter transistors and the bases of the complementary transistors will have a favorable effect on the speed of the circuit also in I²L circuits having another topology which is not based on the lay-outs described and also without the use of dielectric isolation. Nevertheless, the improvement achieved by the invention is more than the sum of the individual effects of the measures described. Combined in the same integrated circuit they cooperate so that the described effects are multiplied. Especially the combination results in an advantageous I²L circuit having a compact structure which can readily be handled in designing the topology and which has a high speed and a low product of dissipation and delay time.

In addition to the silicon, other semiconductor materials may also be used, such as germanium or $A_{III}B_V$ compounds. The insulating layers will usually consist of silicon dioxide and/or silicon nitride. The conductor tracks may also consist of molybdenum, titanium-platinum-gold, polycrystalline semiconductor material or another suitable conductive material or combination of conductive materials.

The conductivity types described may be reversed if also the polarity of the voltages applied during operation is reversed.

In the examples, each gate circuit has only one (collector of a) complementary transistor which is usually situated at one of the ends of the gate circuit. However, the gate circuit may also be constructed with two or more complementary transistors and, for example, with two complementary transistors situated at either end of the gate circuit.

What is claimed is:

1. An integrated circuit comprising a common semiconductor body portion, said body portion comprising plural gate circuits each comprising at least one inverter transistor having emitter and base zones and at least one collector, and a complementary transistor connected to the inverter transistor for biasing same and having emitter, base and collector zones with the complementary transistor having its collector zone connected to the inverter transistor base zone, and each gate circuit having means connecting the complementary transistor base zone and the inverter transistor emitter zone in a d.c. path, said inverter transistors being arranged along substantially parallel rows with all the inverter transistor collectors of the same gate circuit being located along the same row and wherein at least some of the gate circuits occupy different lengths in the row direction, means for interconnecting inverter transistor collectors and base zones of different gate circuits located in different rows to form desired logic, said inverter transistor collector and base zone interconnecting means comprising a group of elongated signal tracks substantially all of which extend substantially their entire length in mutually parallel straight lines and over the body substantially transversely to the row directions, said signal-track-interconnected collectors in different rows being located under the interconnecting signal track, at least plural tracks in the group of signal tracks interconnecting gate circuits in non-adjacent rows and crossing over at least one gate circuit in an intervening row, a plurality of said gate circuits each having connections to said signal tracks that are spaced apart in the row direction by distances that are different from the spacings of signal track connections to other gate circuits, the biasing complementary transistor emitter zones being located along a column extending parallel to and located alongside the said group of signal tracks, and means for isolating adjacent rows of inverter transistors, wherein the body portion comprises a surface layer of first type conductivity on a substrate of second type conductivity and at the interface of the surface layer and the substrate plural buried regions of the first type conductivity are provided which are separate from each other and have a higher doping concentration than that of the surface layer, means for dividing the surface layer into plural separated islands each of which adjoins only one of the more highly doped buried regions, some of said buried regions each constituting part of a common emitter of a plurality of inverter transistors, others of said buried regions each constituting part of a common base zone for one or more complementary transistors, whereby the inverter transistor emitters of the gate circuits are separated in the semiconductor body from the associated complementary transistor base zone.

2. An integrated circuit as claimed in claim 1, wherein means are present to apply a potential difference between at least one of the common emitters of the inverter transistors and the base zone of the associated complementary transistor.

3. An integrated circuit as claimed in claim 2, wherein the means to apply a potential difference comprise at least one impedance element in or on the semiconductor body.

4. An integrated circuit as claimed in claim 3, wherein the impedance element is a resistor.

5. An integrated circuit as claimed in claim 3, wherein a diode is connected parallel to the emitter-base junction of the complementary transistor, said diode being formed by a further collector zone in the complementary transistor which is short-circuited with its base zone.

6. An integrated circuit as claimed in claim 2, wherein the potential difference is at least 30 mV and at most 500 mV.

7. An integrated circuit as claimed in claim 6, wherein the potential difference is between approximately 60 mV and 300 mV.

8. An integrated circuit as claimed in claim 6, wherein at least the surface-adjoining part of the said strip-shaped surface region has a doping concentration which is larger than the original doping concentration of the surface layer.

9. An integrated circuit as claimed in claim 8, wherein at the surface the said strip-shaped surface region is covered substantially entirely by and is conductively connected to a conductor track.

10. An integrated circuit as claimed in claim 6, wherein at the surface of the semiconductor body a conductive connection is present which extends transversely to the direction of the rows and which interconnects strip-shaped surface regions extending in the direction of the rows.

11. An integrated circuit comprising a common semiconductor body portion, said body portion comprising plural gate circuits each comprising at least one inverter transistor having emitter and base zones and at least one collector and a complementary transistor connected to the inverter transistor for biasing same and having emitter, base and collector zones, a group of signal tracks on the body, means for connecting inverter transistor collectors of different gate circuits to the signal tracks to form desired logic, means for connecting the complementary transistor collector to the base zone of the inverter transistor it is to bias, and impedance means including a Schottky diode coupled between the complementary transistor base zone and the inverter transistor emitter for establishing a small potential difference therebetween.

12. A circuit as claimed in claim 11, wherein the potential difference is approximately 60-300 mV.

13. An integrated circuit comprising a common semiconductor body portion, said body portion comprising plural gate circuits each comprising at least one inverter transistor having emitter and base zones and at least one collector and a complementary transistor connected to the inverter transistor for biasing same and having emitter, base and collector zones with the complementary transistor collector zone conected to the inverter transistor base zone and each gate circuit having means connecting the complementary transistor base zone and the inverter transistor emitter zone in a d.c. path, said inverter transistors being arranged along substantially parallel rows with all the inverter transistor collectors of the same gate circuit being located along the same row, a group of substantially straight and substantially parallel signal tracks on the body and extending substantially transversely to the row directions, means for connecting inverter transistor collectors of different gate circuits located in different rows to the signal tracks to form desired logic, said signal-track-interconnected collectors in different rows being located under the interconnecting signal track, the biasing complementary transistors being located alongside the said group of signal tracks, means for isolating adjacent rows of inverter transistors, said body portion comprising a surface layer of a first type conductivity and of given conductivity on a substrate having at least one region of first type conductivity but of higher conductivity than the given conductivity, the inverter transistor base zones being second type locally overdoped zones located above and adjoining said higher conductivity one region, the second type doping profile in the inverter transistor base zones decreasing from the said one region towards the surface of the surface layer, and the inverter transistor base zones having active parts present between the inverter transistor emitter and collector and adjoining inactive parts which extend up to the surface and which comprise a more highly doped region, the volume integral of the impurity doping per surface unit of the inverter transistor base zone being smaller for the active part than for the inactive part.

14. An integrated circuit as claimed in claim 13, wherein the quotient of the volume integral of the doping and the volume for the active parts of the base zones is smaller than for the inactive parts.

15. An integrated circuit as claimed in claim 13, wherein the doping profile in the more highly doped regions belonging to the inactive parts of the base zone decrease at least over part of the distance from the surface of the body into the body.

16. An integrated circuit comprising a common semiconductor body portion, said body portion comprising plural gate circuits each comprising at least one inverter transistor having emitter and base zones and at least one collector and a complementary transistor connected to the inverter transistor for biasing same and having emitter, base and collector zones with the complementary transistor collector zone connected to the inverter transistor base zone and each gate circuit having means connecting the complementary transistor base zone and the inverter transistor emitter zone in a d.c. path, said inverter transistors being arranged along substantially parallel rows with all the inverter transistor collectors of the same gate circuit being located along the same row, a group of substantially straight and substantially parallel signal tracks on the body and extending substantially transversely to the row directions, means for connecting inverter transistor collectors of different gate circuits located in different rows to the signal tracks to form desired logic, said signal-track-interconnected collectors in different rows being located under the interconnecting signal track, the biasing complementary transistors being located alongside the said group of signal tracks, means for isolating adjacent rows of inverter transistors, and means to reduce the input series resistance of the gate circuits, said series resistance reducing means including said inverter transistors of a gate circuit present in a row having a common comb-shaped base zone, the ridge of the comb extending in the direction of the rows and the teeth of the comb which extend transversely to the ridge comprising the collectors of the inverter transistors.

17. An integrated circuit as claimed in claim 16, wherein the ridge of the comb-shaped base zone has a higher doping concentration than the parts of the base zone on which the collectors are provided.

18. An integrated circuit comprising a common semiconductor body portion, said body portion comprising plural gate circuits each comprising at least one inverter transistor having emitter and base zones and at least one collector and a complementary transistor connected to the inverter transistor for biasing same and having emitter, base and collector zones with the complementary transistor collector zone connected to the inverter transistor base zone and each gate circuit having means connecting the complementary transistor base zone and the inverter transistor emitter zone in a d.c. path, said inverter transistors being arranged along substantially parallel rows with all the inverter transistor collectors of the same gate circuit being located along the same row, a group of substantially straight and substantially parallel signal tracks on the body and extending substantially transversely to the row directions, means for connecting inverter transistor collectors of different gate circuits located in different rows to the signal tracks to form desired logic, said signal-track-interconnected collectors in different rows being located under the interconnecting signal track, the biasing complementary transistors being located alongside the said group of signal tracks, means for isolating adjacent rows of inverter transistors, and means to reduce the input series resistance of the gate circuits, said series resistance reducing means including said gate circuits being constructed in the form of a comb having a ridge and teeth with the inverter transistor base zones arranged as the teeth of the comb transversely to the ridge, the ridge comprising a strip-shaped conductor track on the body contacting the inverter transistor base zones and being connected to the associated collector zones of the biasing complementary transistor.

19. An integrated circuit as claimed in claim 18, wherein the comb-shaped gate circuit teeth are present only at one long side of the ridge.

20. An integrated circuit as claimed in claim 19, wherein adjacent gate circuits are arranged two by two with their long sides having the projecting teeth facing each other and in interdigitating relationship.

21. An integrated circuit as claimed in claim 20, wherein the complementary transistors for the two gate circuits which face each other have a common emitter zone, said complementary transistor emitter zone being a surface zone of the second type conductivity which is located between the ridges of said two gate circuits and spaced therefrom by a semiconductor part of first type conductivity.

22. An integrated circuit comprising a common semiconductor body portion, said body portion comprising plural gate circuits each comprising at least one inverter transistor having emitter and base zones and at least one collector, and a complementary transistor connected to the inverter transistor for biasing same and having emitter, base and collector zones with the complementary transistor having its collector zone connected to the inverter transistor base zone, and each gate circuit having means connecting the complementary transistor base zone and the inverter transistor emitter zone in a d.c. path, said inverter transistors being arranged along substantially parallel rows with all the inverter transistor collectors of the same gate circuit being located along the same row and wherein at least some of the gate circuits occupy different lengths in the row direction, means for interconnecting inverter transistor collectors and base zones of different gate circuits located in different rows to form desired logic, said inverter transistor collector and base zone interconnecting means comprising a group of elongated signal tracks substantially all of which extend substantially their entire length in mutually parallel straight lines and over the body substantially transversely to the row directions, said signal-track-interconnected collectors in different rows being located under the interconnecting signal track, at least plural tracks in the group of signal tracks interconnecting gate circuits in non-adjacent rows and crossing over at least one gate circuit in an intervening row, a plurality of said gate circuits each having connections to said signal tracks that are spaced apart in the row direction by distances that are different from the spacings of signal track connections to other gate circuits, the biasing complementary transistor emitter zones being located along a column extending parallel to and located alongside the said group of signal tracks, and means for isolating adjacent rows of inverter transistors, wherein the body comprises a surface layer of a first type conductivity and of given conductivity on a substrate having at least one region of first type conductivity but of higher conductivity than the given conductivity, the inverter transistor base zones being second type locally overdoped zones located above and adjoining said higher conductivity one region and the second type doping profile in the inverter transistor base zones decreases from the said one region towards the surface of the surface layer.

23. An integrated circuit comprising a common semiconductor body portion, said body portion comprising plural logic gate circuits each comprising at least one inverter transistor having emitter and base zones and at least one collector and a complementary transistor connected to the inverter transistor for biasing same and having emitter, base and collector zones with the complementary transistor collector zone connected to the inverter transistor base zone and each gate circuit having means connecting the complementary transistor base zone and the inverter transistor emitter zone in a d.c. path, said inverter transistors being arranged along substantially parallel rows which are divided into groups each comprising at least two rows with all the inverter transistor collectors of the same gate circuit being located along the same row, a group of substantially straight and substantially parallel signal tracks on the body and extending substantially transversely to the row directions, means for connecting inverter transistor collectors of different gate circuits located in different rows to the signal tracks to form desired logic, said signal-track-interconnected collectors in different rows being located under the interconnecting signal track, the biasing complementary transistors being located alongside said group of signal tracks, the inverter transistor emitter zones being of a first type conductivity, the inverter base zones being of a second, opposite type conductivity, dielectric isolation means extending from the surface into the body between the base zones of the inverter transistors for isolating adjacent rows of inverter transistors, said body portion comprising a surface layer of a first type conductivity at whose surface is provided a connection for the emitter zones of the inverter transistors, a plurality of strip-shaped surface regions of the first type conductivity each forming a portion of said surface layer and having a thickness extending from the surface at least partly into the layer and a width extending laterally between adjacent ones of said rows and a length extending in the direction of the rows, the inverter transistor emitter zones of said adjacent rows extending to and being in direct contact with the strip-shaped surface region situated therebetween, said dielectric isolation means including a portion extending from the surface into the body and laterally separating each strip-shaped region from the adjacent rows of inverter transistors.

24. An integrated circuit comprising a common semiconductor body portion, said body portion comprising plural gate circuits each comprising at least one inverter transistor having emitter and base zones and at least one collector, and a complementary transistor connected to the inverter transistor for biasing same and having emitter, base and collector zones with the complementary transistor having its collector zone connected to the inverter transistor base zone, and each gate circuit having means connecting the complementary transistor base zone and the inverter transistor emitter zone in a d.c. path, said inverter transistor being arranged along substantially parallel rows with all the inverter transistor collectors of the same gate circuit being located along the same row and wherein at least some of the gate circuits occupy different lengths in the row direction means for interconnecting inverter transistor collectors and base zones of different gate circuits located in different rows to form desired logic, said inverter transistor collector and base zone interconnecting means comprising a group of elongated signal tracks substantially all of which extend substantially their entire length in mutually parallel straight lines and over the body substantially transversely to the row directions, said signal-track-interconnected collectors in different rows being located under the interconnecting signal track, at least plural tracks in the group of signal tracks interconnecting gate circuits in nonadjacent rows and crossing over at least one gate circuit in an intervening row, a plurality of said gate circuits each having connections to said signal tracks that are spaced apart in the row direction by distances that are different from the spacings of signal track connections to other gate circuits, the biasing complementary transistor emitter zones being located along a column extending parallel to and located alongside the said group of signal tracks, means for isolating adjacent rows of inverter transistors, said body portion comprising a surface layer of first type conductivity on a substrate of second type conductivity and at the interface of the surface layer and the substrate plural buried regions of the first type conductivity are provided which are separate from each other and have a higher doping concentration than that of the surface layer, means for dividing the surface layer into plural separated islands each of which adjoins only one of the more highly doped buried regions, some of said buried regions each constituting part of a common emitter of a plurality of inverter transistors, others of said buried regions each constituting part of a common base zone for one or more complementary transistors, whereby the inverter transistor emitters of the gate circuits are separated in the semiconductor body from the associated complementary transistor base zone, and means including a Schottky diode in or on said semiconductor body for applying a potential difference between at least one of the common emitters of the inverter transistors and the base zone of the associated complementary transistor.

25. An integrated circuit comprising a common semiconductor body portion, said body portion comprising plural gate circuits each comprising at least one inverter transistor having emitter and base zones and at least one collector, and a complementary transistor connected to the inverter transistor for biasing same and having emitter, base and collector zones with the complementary transistor having its collector zone connected to the inverter transistor base zone, and each gate circuit having means connecting the complementary transistor base zone and the inverter transistor emitter zone in a d.c. path, said inverter transistors being arranged along substantially parallel rows with all the inverter transistor collectors of the same gate circuit being located along the same row and wherein at least some of the gate circuits occupy different lengths in the row direction, means for interconnecting inverter transistor collectors and base zones of different gate circuits located in different rows to form desired logic, said inverter transistor collector and base zone interconnecting means comprising a group of elongated signal tracks substantially all of which extend substantially their entire length in mutually parallel straight lines and over the body substantially transversely to the row directions, said signal-track-interconnected collectors in different rows being located under the interconnecting signal track, at least plural tracks in the group of signal tracks interconnecting gate circuits in nonadjacent rows and crossing over at least one gate circuit in an intervening row, a plurality of said gate circuits each having connections to said signal tracks that are spaced apart in the row direction by distances that are different from the spacings of signal track connections to other gate circuits, the biasing complementary transistor emitter zones being located along a column extending parallel to and located alongside the said group of signal tracks, means for isolating adjacent rows of inverter transistors, said body portion comprising a surface layer of first type conductivity on a substrate of second type conductivity and at the interface of the surface layer and the substrate plural buried regions of the first type conductivity are provided which are separate from each other and have a higher doping concentration than that of the surface layer, means for dividing the surface layer into plural separated islands each of which adjoins only one of the more highly doped buried regions, some of said buried regions each constituting a part of a common emitter of a plurality of inverter transistors, others of said buried regions each constituting part of a common base zone for one or more complementary transistors, whereby the inverter transistor emitters of the gate circuits are separated in the semiconductor body from the associated complementary transistor base zone, at least some of the complementary transistors being arranged in plural groups in which they have their base zones connected together and further including an impedance element coupling said base zones of each group to the common emitter of the associated inverter transistors for applying a potential difference therebetween.

26. An integrated circuit comprising a common semiconductor body portion, said body portion comprising plural gate circuits each comprising at least one inverter transistor having emitter and base zones and at least one collector lying above said base zone and a complementary transistor connected to the inverter transistor for biasing same and having emitter, base and collector zones with the complementary transistor having its collector zone connected to the inverter transistor base zone, and each gate circuit having means connecting the complementary transistor base zone and the inverter transistor emitter zone in a d.c. path, said inverter transistors being arranged along substantially parallel rows with all the inverter transistor collectors of the same gate circuit being located along the same row and wherein at least some of the gate circuits occupy different lengths in the row direction, means for interconnecting inverter transistor collectors and base zones of different gate circuits located in different rows to form desired logic, said inverter transistor collector and base zone interconnecting means comprising a group of elongated signal tracks substantially all of which extend substantially their entire length in mutually parallel straight lines and over the body substantially transversely to the row directions, said signal-track-interconnected collectors in different rows being located under the interconnecting signal track, at least plural tracks in the group of signal tracks interconnecting gate circuits in nonadjacent rows and crossing over at least one gate circuit in an intervening row, a plurality of said gate circuits each having connections to said signal tracks that are spaced apart in the row direction by distances that are different from the spacings of signal track connections to other gate circuits, the biasing complementary transistor emitter zones being located along a column extending parallel to and located alongside the said group of signal tracks, means for isolating adjacent rows of inverter transistors, and means for reducing the input series resistance of the gate circuits, said last-mentioned means comprising a more highly doped body portion in and extending substantially the full length of each of a plurality of the inverter transistor base zones, the parts of the inverter transistor base zone located directly under each inverter transistor collector being spaced from said more highly doped body portion of the inverter transistor base zone.

* * * * *